US009224488B2

(12) United States Patent
Shikata et al.

(10) Patent No.: US 9,224,488 B2
(45) Date of Patent: Dec. 29, 2015

(54) SEMICONDUCTOR MEMORY DEVICE

(71) Applicant: KABUSHIKI KAISHA TOSHIBA, Minato-ku, Tokyo (JP)

(72) Inventors: Go Shikata, Yokohama (JP); Takuya Futatsuyama, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 267 days.

(21) Appl. No.: 13/830,263

(22) Filed: Mar. 14, 2013

(65) Prior Publication Data

US 2014/0071763 A1 Mar. 13, 2014

(30) Foreign Application Priority Data

Sep. 13, 2012 (JP) ................................ 2012-201847

(51) Int. Cl.
*G11C 16/04* (2006.01)
*G11C 16/06* (2006.01)
*G11C 16/26* (2006.01)
*G11C 16/34* (2006.01)

(52) U.S. Cl.
CPC ............ *G11C 16/26* (2013.01); *G11C 16/0483* (2013.01); *G11C 16/06* (2013.01); *G11C 16/3418* (2013.01)

(58) Field of Classification Search
CPC .... G11C 16/26; G11C 16/06; G11C 16/0483; G11C 16/3418; H01L 27/11526
See application file for complete search history.

(56) References Cited

U.S. PATENT DOCUMENTS

| 5,311,462 | A | * | 5/1994 | Wells ......................... 365/49.1 |
| 5,731,606 | A | * | 3/1998 | Shrivastava et al. .......... 257/202 |
| 6,337,506 | B2 | * | 1/2002 | Morishita et al. ............. 257/500 |
| 7,212,434 | B2 | * | 5/2007 | Umezawa ................ 365/185.01 |
| 7,518,921 | B2 | * | 4/2009 | Maejima et al. ......... 365/185.17 |
| 7,528,046 | B2 | * | 5/2009 | Ichige et al. .................. 438/296 |
| 7,700,977 | B2 | | 4/2010 | Church et al. |
| 2003/0111671 | A1 | | 6/2003 | Araki et al. |

(Continued)

FOREIGN PATENT DOCUMENTS

| JP | 2008-085101 A | 4/2008 |
| JP | 2011151150 A | 8/2011 |
| JP | 2011249679 A | 12/2011 |

OTHER PUBLICATIONS

Japanese Office Action dated Jan. 27, 2015 (and English translation thereof), issued in counterpart Japanese Application No. 2012-201847.

*Primary Examiner* — Huan Hoang
*Assistant Examiner* — Roberto Mancera
(74) *Attorney, Agent, or Firm* — Holtz, Holtz, Goodman & Chick PC

(57) ABSTRACT

According to one embodiment, a semiconductor memory device includes the following structure. A memory cell array includes memory cells arranged at positions where bit lines and word lines cross are arranged on a semiconductor substrate. A sense amplifier reads data stored in the memory cell. The hookup region includes a transfer transistor arranged between the memory cell array and the sense amplifier. One end of a current path of the transfer transistor is connected to a first interconnect formed between the semiconductor substrate and the bit line. The other end of the current path is connected to the sense amplifier. A guard ring region is arranged between the memory cell array and the hookup region. A contact plug is arranged to overlap the guard ring region.

18 Claims, 24 Drawing Sheets

(56) References Cited

U.S. PATENT DOCUMENTS

2008/0303115 A1* 12/2008 Miyazaki et al. ............ 257/506
2010/0052030 A1 3/2010 Sakaguchi et al.
2011/0176347 A1 7/2011 Hisada et al.
2011/0198554 A1* 8/2011 Iijima et al. ..................... 257/2
2011/0292717 A1 12/2011 Ohgami
2014/0063964 A1* 3/2014 Futatsuyama ............ 365/185.17

* cited by examiner

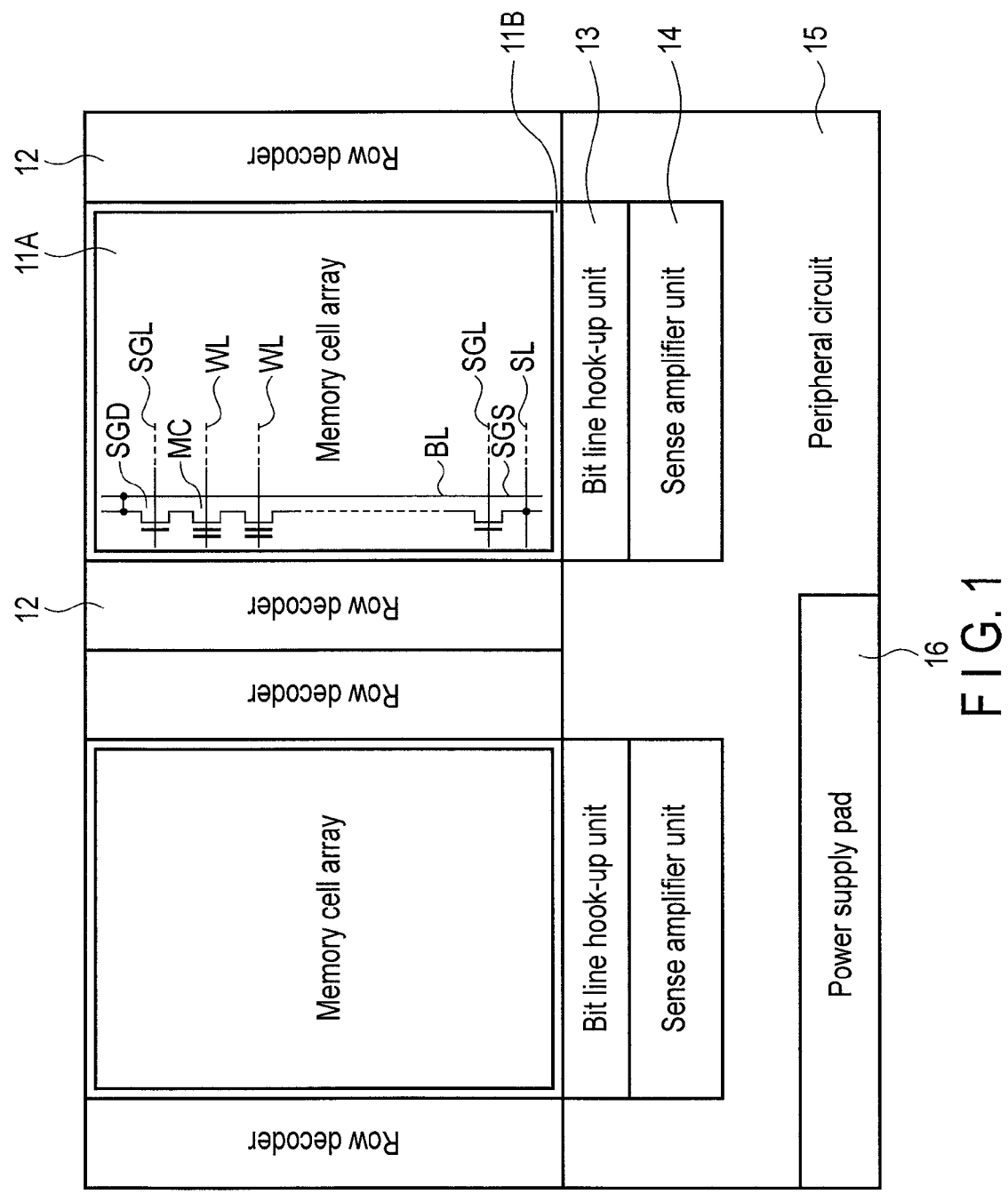

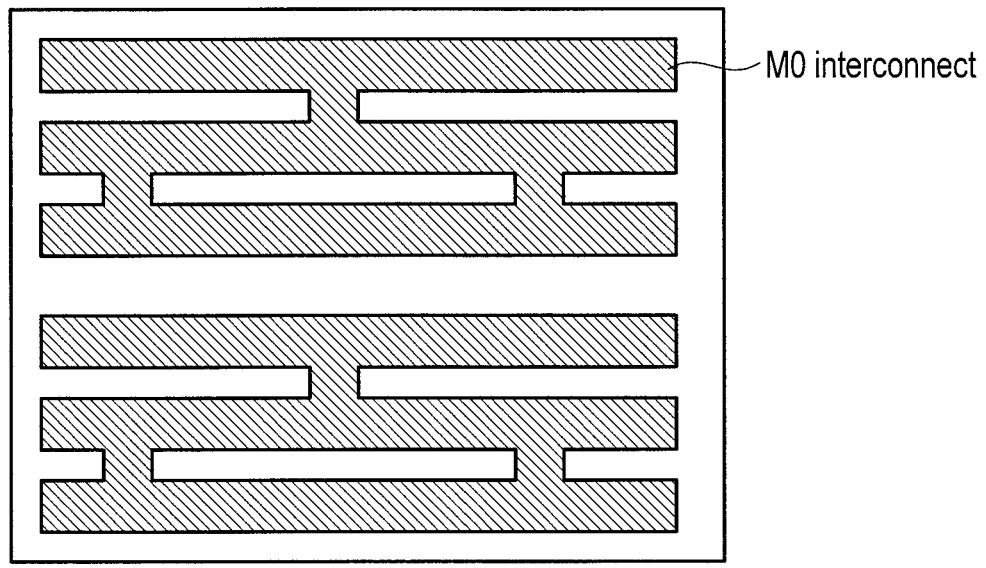
F I G. 2A
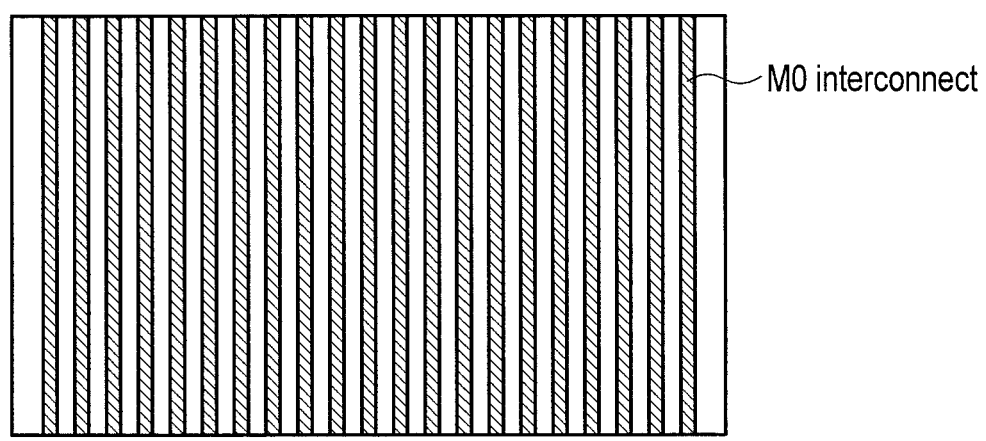
F I G. 2B

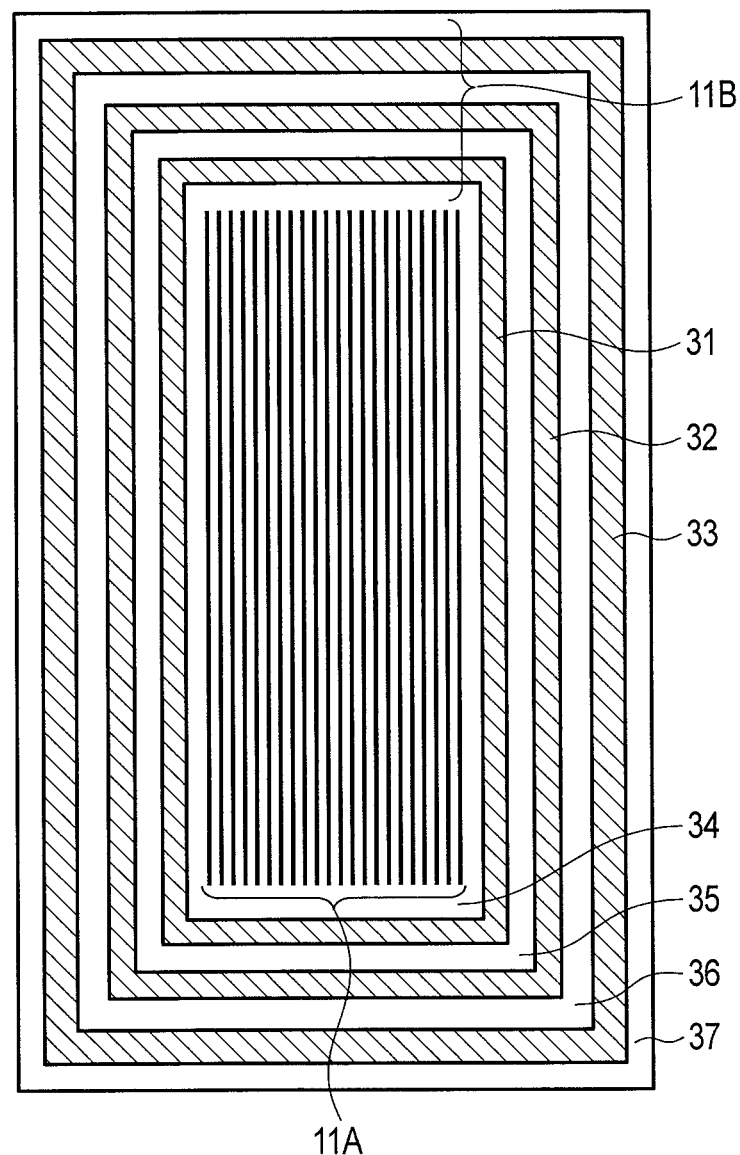
F I G. 5

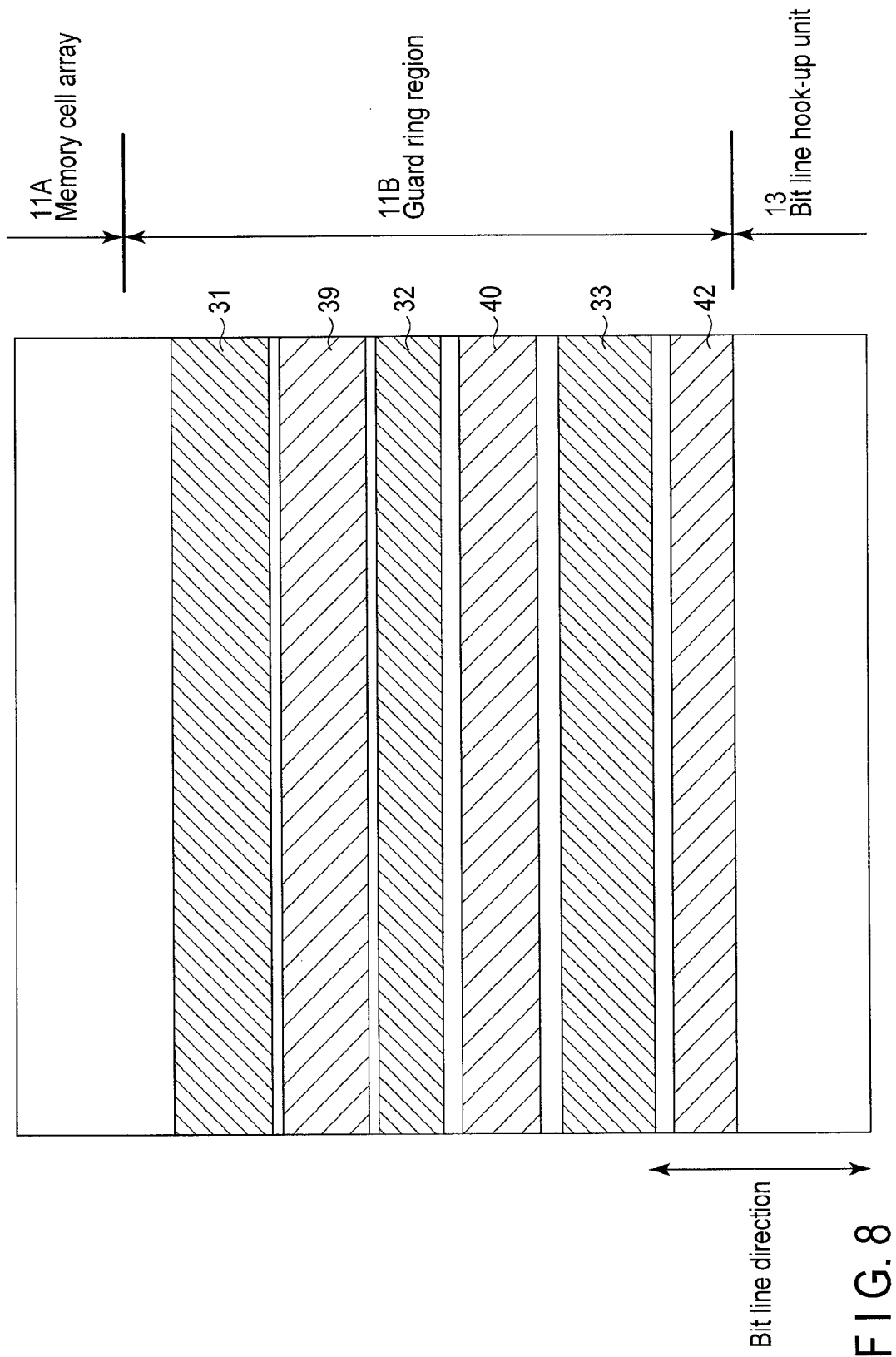
F I G. 8

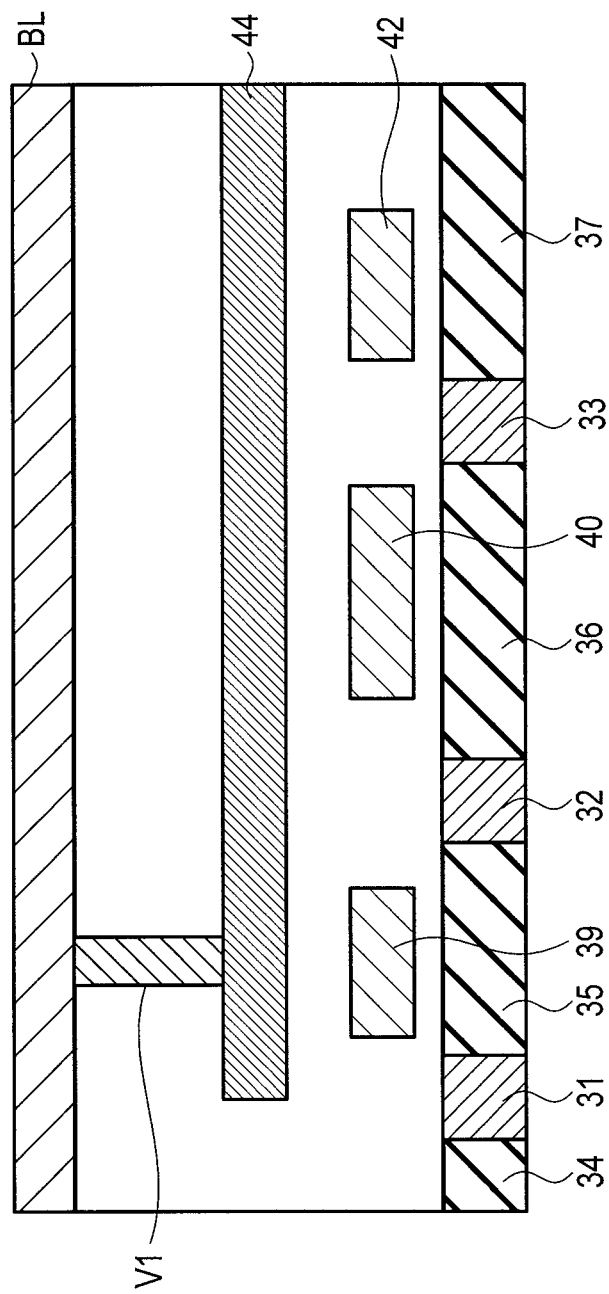
F I G. 11

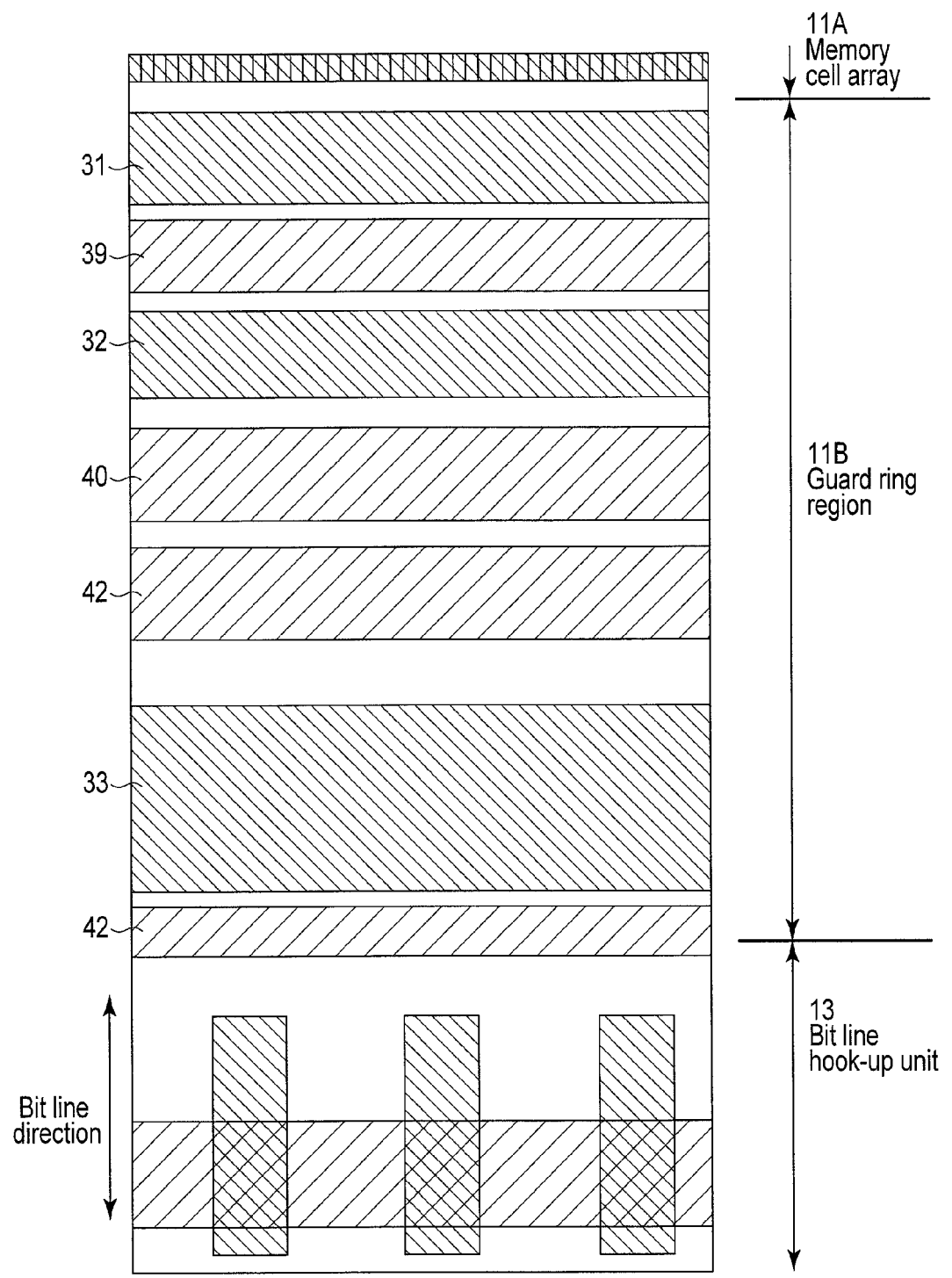
F I G. 13

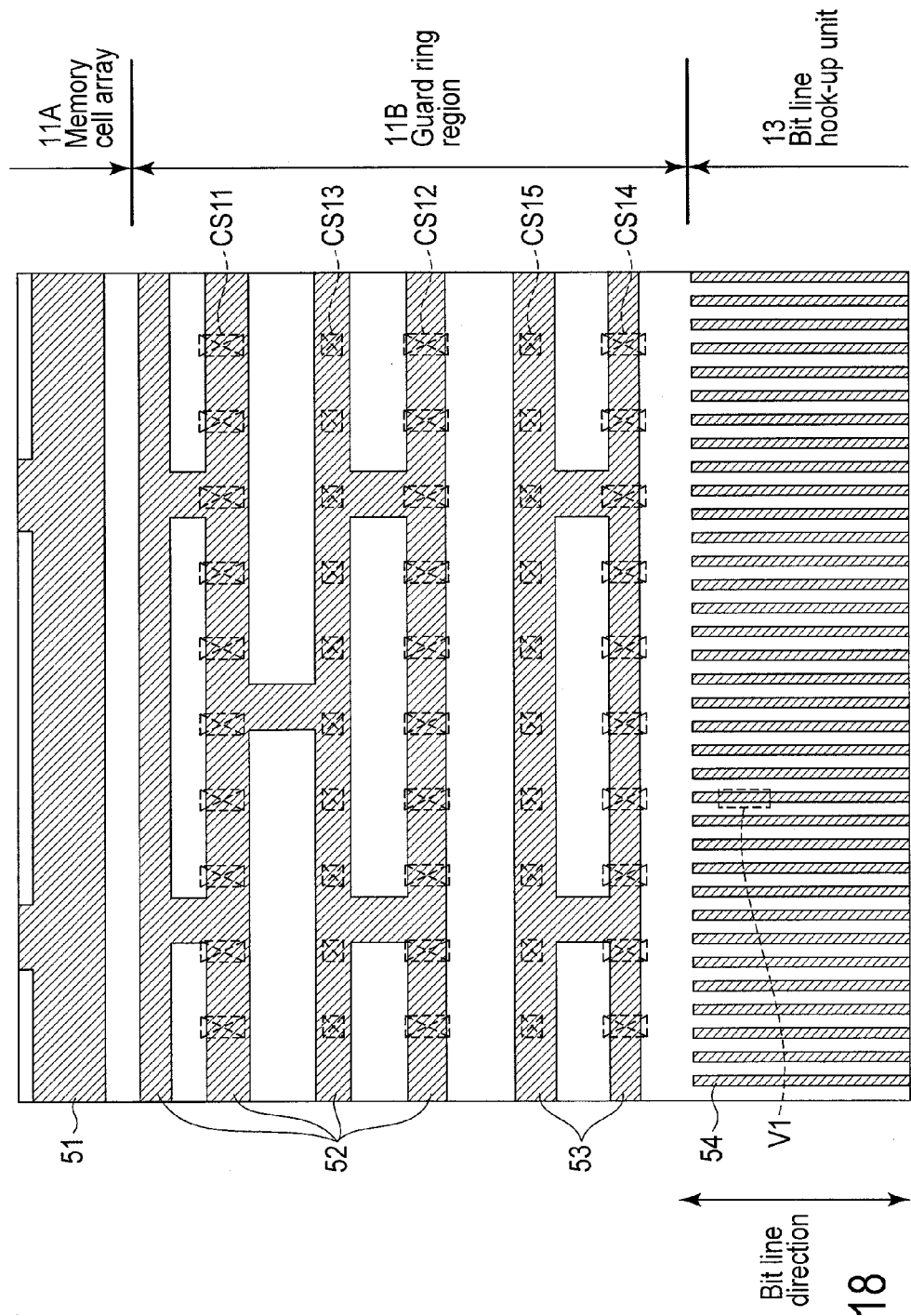
F I G. 18

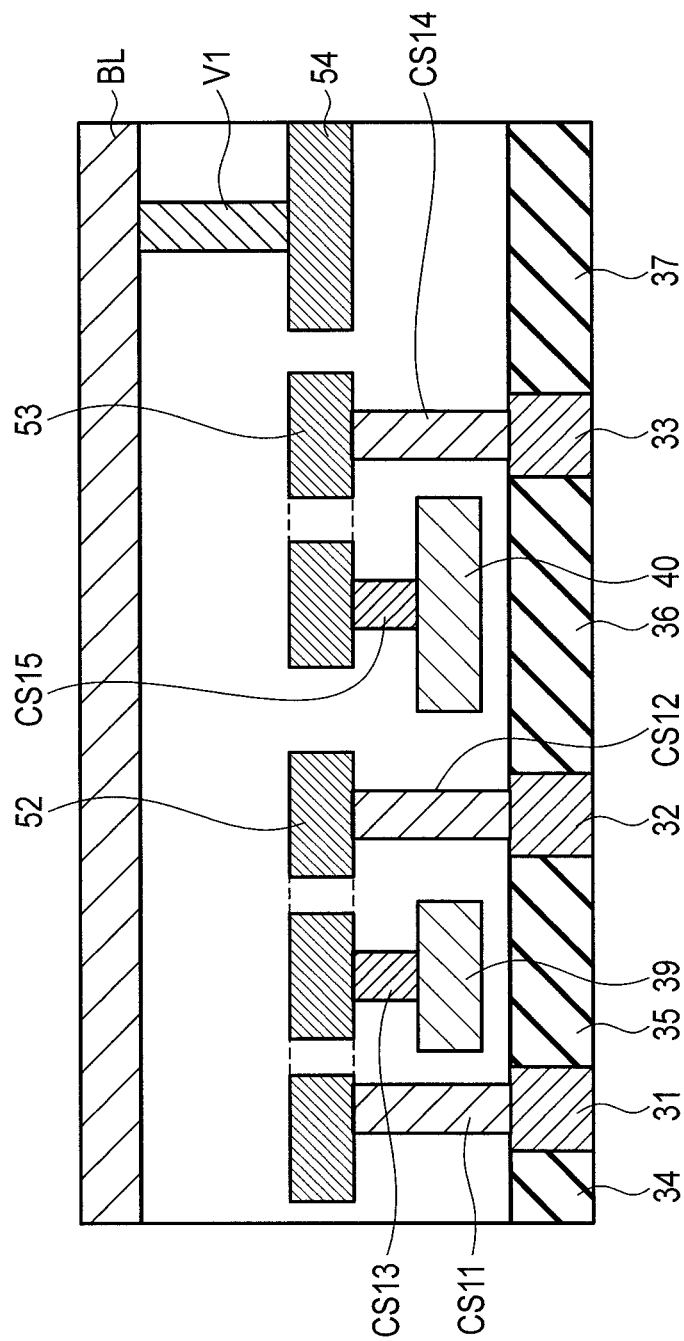
F I G. 19

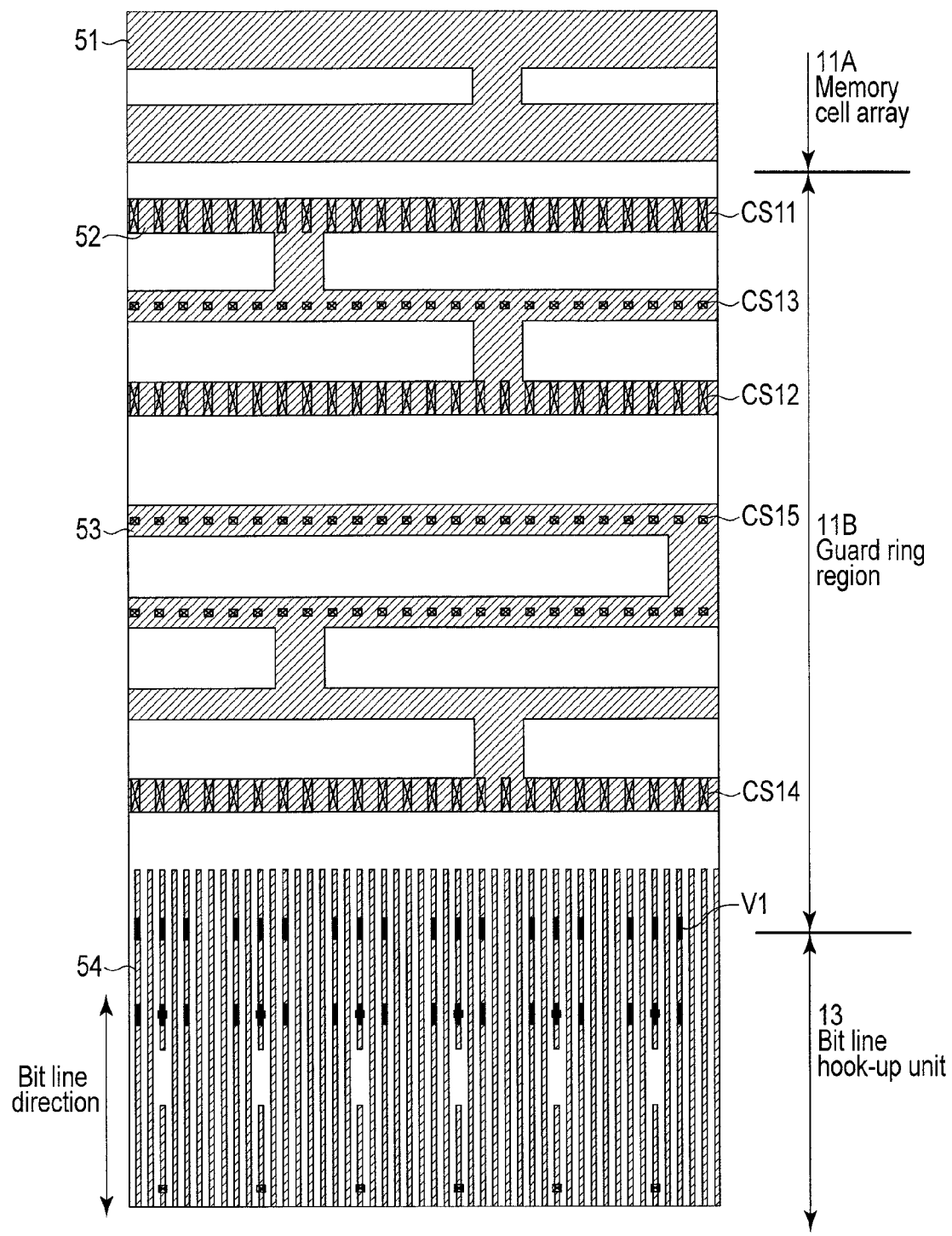
F I G. 22

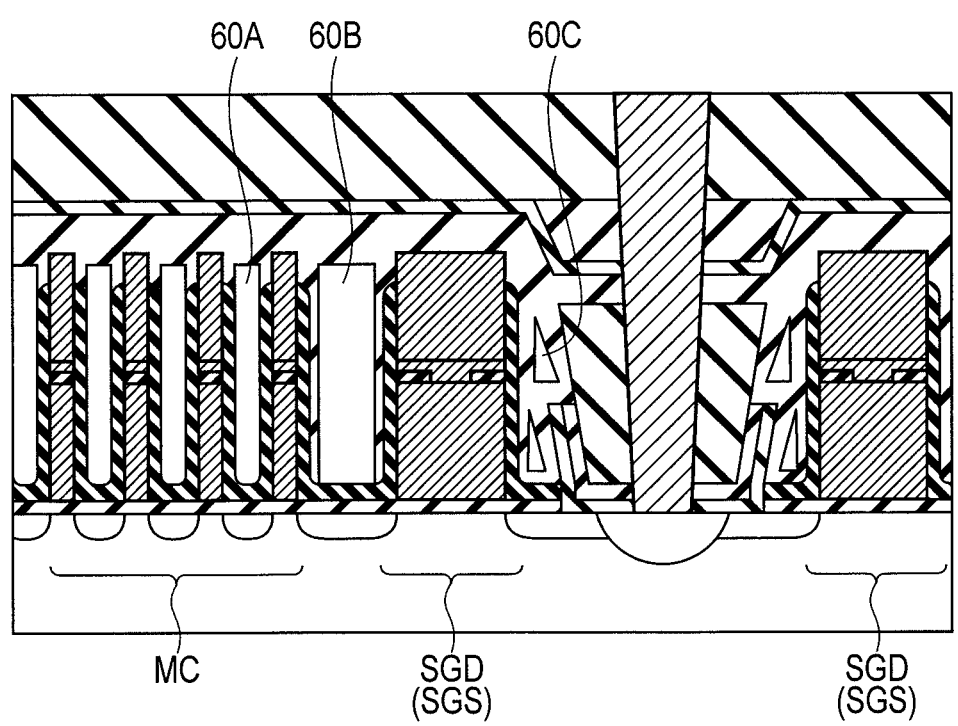
F I G. 24

US 9,224,488 B2

SEMICONDUCTOR MEMORY DEVICE

CROSS-REFERENCE TO RELATED APPLICATIONS

This application is based upon and claims the benefit of priority from Japanese Patent Application No. 2012-201847, filed Sep. 13, 2012, the entire contents of which are incorporated herein by reference.

FIELD

Embodiments described herein relate generally to a semiconductor memory device.

BACKGROUND

A semiconductor memory device, for example, a NAND flash memory includes a memory cell array arranged with a plurality of memory cells and a peripheral circuit arranged around the memory cell array. Further, a guard ring region having cell guard rings are provided between the memory cell array and the peripheral circuit. However, in the guard ring region, an interconnect for giving potential to the cell guard ring is provided, and therefore, it is difficult to effectively make use of the guard ring region.

BRIEF DESCRIPTION OF THE DRAWINGS

FIG. 1 is a block diagram illustrating an overall configuration of a NAND flash memory according to a first embodiment;

FIGS. 2A and 2B are figures illustrating pattern of M0 interconnect arranged in a bit line hookup unit and a memory cell array according to the first embodiment;

FIG. 5 is a top view illustrating a layout of cell guard rings formed in a guard ring region according to the first embodiment;

FIGS. 7-9 are top views illustrating pattern layouts of the guard ring region according to the first embodiment;

FIG. 11 is a cross sectional view illustrating of the guard ring region as illustrated in FIG. 7 taken along line B-B;

FIGS. 12-14 are figures illustrating detailed example of the pattern layout of the guard ring region according to the first embodiment;

FIGS. 16-18 are top views illustrating pattern layouts of the guard ring region according to a second embodiment;

FIG. 19 is a cross sectional view illustrating of the guard ring region as illustrated in FIG. 16 taken along line D-D;

FIGS. 20-22 are figures illustrating detailed example of the pattern layout of the guard ring region according to the second embodiment;

FIG. 24 is a cross sectional view illustrating an example of a select gate transistor and a memory cell used in the first, second embodiments.

DETAILED DESCRIPTION

Figure 3:
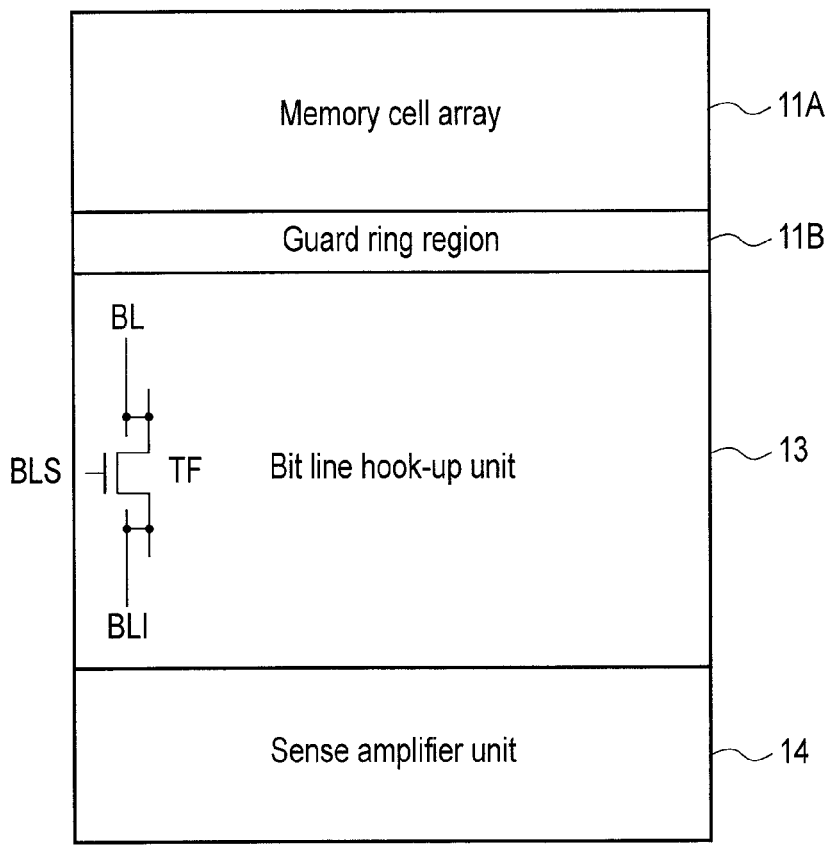
FIG. 3 is a circuit diagram illustrating a transfer transistor provided in the bit line hookup unit according to the first embodiment.

A semiconductor memory device according to embodiments will be hereinafter explained with reference to the drawings. In this case, for example, a NAND flash memory is explained as a semiconductor memory device. In the following description, constituent elements having substantially the same function and configuration are denoted with the same reference numerals, and repeated explanation thereabout will be made only when it is necessary.

In general, according to one embodiment, a semiconductor memory device includes a memory cell array, a sense amplifier, a hookup region, a guard ring region and a first contact plug. The memory cell array includes memory cells arranged at positions where bit lines and word lines cross each other are arranged on a semiconductor substrate. The sense amplifier is configured to read data stored in one of the memory cells via the bit line in read operation. The hookup region includes a transfer transistor arranged between the memory cell array and the sense amplifier. One end of a current path of the transfer transistor is connected to a first interconnect formed between the semiconductor substrate and the bit line. The other end of the current path of the transfer transistor is connected to the sense amplifier. The guard ring region is arranged between the memory cell array and the hookup region and encloses the memory cell array. The guard ring region includes a cell guard ring providing potential to the semiconductor substrate. The first contact plug is arranged to overlap the guard ring region. The first contact plug electrically connects the bit line to the first interconnect.

First Embodiment

A NAND flash memory according to the first embodiment will be explained.

[1] Overall Configuration

FIG. 1 is a block diagram illustrating an overall configuration of a NAND flash memory according to a first embodiment;

As illustrated in the figure, the NAND flash memory includes a memory cell array 11A, a guard ring region 11B, a row decoder 12, a bit line hookup unit 13, a sense amplifier unit 14, a peripheral circuit 15, and a power supply pad 16.

At an end portion of the memory cell array 11A, the guard ring region 11B is arranged in such layout to enclose the memory cell array 11A. At both ends (right and left ends) of the memory cell array 11A, the row decoder 12 is arranged with the guard ring region 11B interposed therebetween.

At a lower side of the memory cell array 11A, the sense amplifier unit 14 is arranged. The guard ring region 11B and the bit line hookup unit 13 are arranged between the memory cell array 11A and the sense amplifier unit 14. The guard ring region 11B is arranged between the memory cell array 11A and the bit line hookup unit 13.

At a lower side of the sense amplifier unit 14, the peripheral circuit 15 is arranged. Further, in a lower portion of the peripheral circuit 15, the power supply pad 16 is arranged.

The memory cell array 11A includes NAND cell units. The NAND cell unit includes memory cells MC connected in series, and select gate transistors SGD, SGS connected at both ends so as to sandwich the memory cells MC.

The memory cell MC includes a nonvolatile memory cell transistor including a floating gate electrode and a control gate electrode. One end of the NAND cell unit is connected to the bit line BL via the select gate transistor SGD, and the other end thereof is connected to a common source line SL via the select gate transistor SGS.

The control gate electrodes of the memory cells MC in the same line are connected to the word line WL. The gate electrodes of the select gate transistors SGD, SGS are respectively connected to the select gate lines SGL.

The row decoder 12 selects a particular word line WL on the basis of an address from among word lines WL connected to the memory cells MC in the memory cell array 11A.

The bit line hookup unit 13 is arranged with a transfer transistor (high withstand voltage transistor) for transferring signal between the bit line BL and the sense amplifier unit 14 and a contact plug for connecting the bit line of an M1 interconnect to the M0 interconnect. The M0 interconnect is an interconnect formed in a first interconnect layer above the word line arranged in the memory cell array 11A, and is mainly used as a power source line (source line) for giving a source potential to a source of a cell transistor. The M1 interconnect is an interconnect formed in a second interconnect layer above the M0 interconnect of the memory cell array, and is mainly used as a bit line of a cell transistor.

The sense amplifier unit 14 reads data stored in the memory cell MC from the bit line BL connected to the memory cell MC. More specifically, the sense amplifier unit 14 senses and amplifiers data read from the memory cell MC to the bit line.

The peripheral circuit 15 has a circuit for writing, reading, and erasing the memory cell MC in the memory cell array 11A. A power supply voltage and a reference voltage (for example, ground potential) to operate the NAND flash memory are provided from the power supply pad 16.

Subsequently, the pattern of the M0 interconnect in the bit line hookup unit 13 and the memory cell array 11A will be explained.

FIGS. 2A and 2B are figures illustrating pattern of M0 interconnect arranged in the bit line hookup unit 13 and the memory cell array 11A.

In the NAND flash memory, the M0 interconnect above the word line WL of the memory cell array 11A is mainly used as a power source line (source line) for giving a source potential to a source of the memory cell MC. For this reason, in order to reduce the resistance as much as possible, as illustrated in FIG. 2A, a wide line & space (L&S) pattern is used for the M0 interconnect.

On the other hand, in the bit line hookup unit 13, a transfer transistor (high withstand voltage transistor or high voltage transistor) for connecting the bit line BL on the memory cell array 11A to the sense amplifier unit 14 is arranged.

In the bit line hookup unit 13, the M1 interconnect of bit line is connected to the M0 interconnect, but since all the bit lines or half of the bit lines (the even-numbered bit lines or the odd-numbered bit lines) are to be connected to the M0 interconnect, a narrow line & space pattern is used for the M0 interconnect as illustrated in FIG. 2B.

Subsequently, a transfer transistor formed in the bit line hookup unit 13 between the memory cell array 11A and the sense amplifier unit 14.

FIG. 3 is a circuit diagram illustrating a transfer transistor provided in the bit line hookup unit 13 between the guard ring region 11B and the sense amplifier unit 14.

As illustrated in the figure, the bit line hookup unit 13 has a high withstand voltage transfer transistor TF. One end of an electric current path of the transfer transistor TF is electrically connected to the bit line BL in the memory cell array 11A. The other end of an electric current path of the transfer transistor TF is electrically connected to a interconnect BLI, and the interconnect BLI is connected to a sense circuit in the sense amplifier unit 14.

The sense circuit in the sense amplifier unit 14 is constituted by a transistor of a low withstand voltage (or low voltage) transistor for reading data in a memory cell. During erase operation, by turning off the transfer transistor TF, an erase voltage (for example, equal to or more than 15 V) is prevented from being transferred to the sense amplifier unit 14 constituted by the low withstand voltage transistor.

Figure 4:
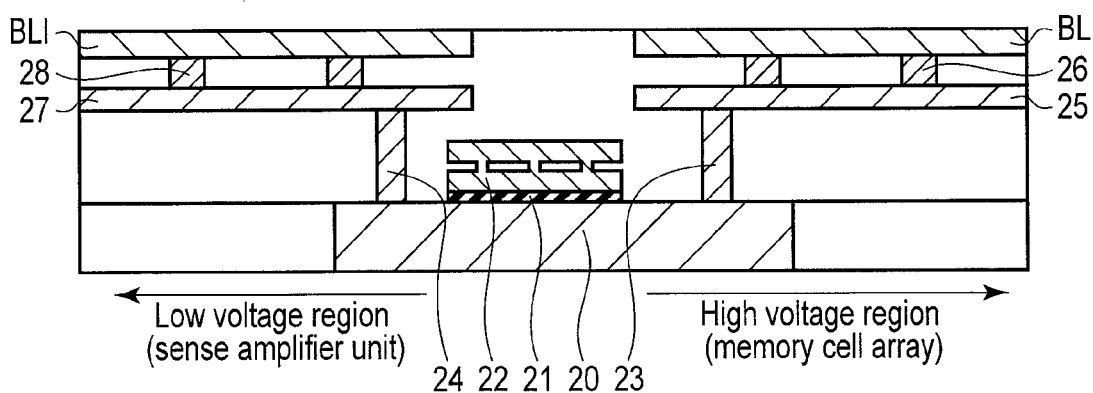
FIG. 4 is a cross sectional view illustrating the transfer transistor provided in the bit line hookup unit according to the first embodiment.

FIG. 4 illustrates a cross sectional structure of the transfer transistor TF provided in the bit line hookup unit 13.

As illustrated in the figure, a gate insulating film 21 is formed in an active area 20 of a semiconductor substrate, and a gate electrode 22 is formed on the gate insulating film 21. Contact plugs 23, 24 are respectively formed on the active area at both sides of the gate electrode 22.

An M0 interconnect 25 is formed on the contact plug 23. Further, contact plugs 26 are formed on the M0 interconnect 25, and an M1 interconnect (bit line) BL is formed on the contact plugs 26.

An M0 interconnect 27 is formed on the contact plug 24. Further, contact plugs 28 are formed on the M0 interconnect 27, and an M1 interconnect BLI is formed on the contact plugs 28.

Subsequently, the guard ring region 11B formed at an end portion of the memory cell array 11A, i.e., an interface portion between the memory cell array 11A and the bit line hookup unit 13, will be explained.

FIG. 5 is a top view illustrating a layout of cell guard rings formed in the guard ring region 11B at the end portion of the memory cell array 11A.

As illustrated in the figure, the memory cell array 11A including memory cells is formed on the semiconductor substrate. Further, cell guard rings 31, 32, 33 are formed on the semiconductor substrate, in this order which are arranged from the side of the memory cell array 11A, so as to enclose the memory cell array 11A. More specifically, the cell guard ring 31 is provided around the memory cell array 11A, and the cell guard ring 32 is provided at the outside of the cell guard ring 31. Further, the cell guard ring 33 is provided at the outside of the cell guard ring 32. The cell guard rings 31, 32, 33 are formed of the active area in the semiconductor substrate.

An element isolation region 34 is provided between the memory cell array 11A and the cell guard ring 31. Element isolation regions 35, 36 are provided between the cell guard rings 31, 32 and between the cell guard ring 32, 33, respectively. Further, the element isolation region 37 is provided at the outside of the cell guard ring 33. The element isolation regions 34, 35, 36, 37 are formed of, for example, a shallow trench isolation (STI).

Figure 6:
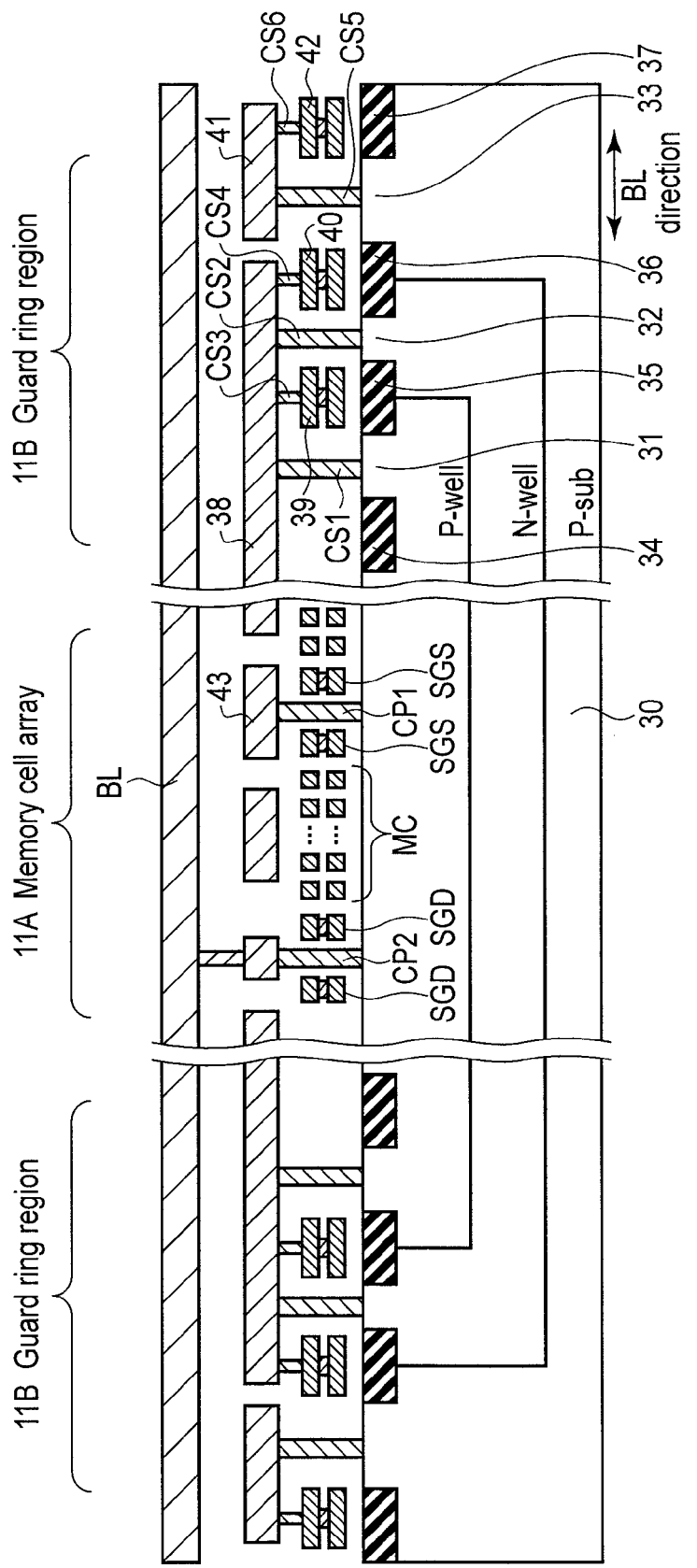
FIG. 6 is a cross sectional view illustrating the guard ring region and the memory cell array according to the first embodiment.

FIG. 6 illustrates a cross sectional structure of the memory cell array 11A and the guard ring region 11B.

As illustrated in the figure, for example, an N-type well region (N-well) is formed in a P-type semiconductor substrate (P-sub) 30. In the N-type well region, a P-type well region (P-well) arranged with the memory cell array 11A is formed. An inter-layer insulating film on the semiconductor substrate 30 is omitted.

Memory cells MC and select transistors SGD, SGS are formed on the P-type well region. The select transistor SGS is connected to the M0 interconnect (source line) 43 via the contact plug CP1. The select transistor SGD is connected to the bit line BL via the contact plug CP2.

The cell guard ring 31 is formed by the P-type well region between the element isolation regions 34, 35. The cell guard ring 32 is formed by the N-type well region between the element isolation regions 35, 36. Further, the cell guard ring 33 is formed by the P-type semiconductor substrate between the element isolation regions 36, 37.

The contact plug CS1 is formed on the cell guard ring 31, and the M0 interconnect 38 is provided on the contact plug CS1. The contact plug CS2 is formed on the cell guard ring 32, and the M0 interconnect 38 is provided on the contact plug CS2.

A GC interconnect 39 is provided above the element isolation region 35. The contact plug CS3 is formed on the GC interconnect 39, and the M0 interconnect 38 is provided on the contact plug CS3. A GC interconnect 40 is provided above the element isolation region 36. The contact plug CS4 is formed on the GC interconnect 40, and the M0 interconnect 38 is provided on the contact plug CS4. The GC interconnect is an interconnect formed in the same interconnect layer as the gate electrode (word line) of the cell transistor.

The cell guard ring 31 is electrically connected to the M0 interconnect 38 via the contact plug CS1, and the cell guard ring 32 is electrically connected to the M0 interconnect 38 via the contact plug CS2. The GC interconnect 39 is electrically connected to the M0 interconnect 38 via the contact plug CS3. The GC interconnect 40 is electrically connected to the M0 interconnect 38 via the contact plug CS4. Accordingly, well potential is provided to the cell guard rings 31, 32 with the M0 interconnect 38 and GC interconnects 39, 40.

The contact plug CS5 is formed on the cell guard ring 33, and the M0 interconnect 41 is formed on the contact plug CS5. A GC interconnect 42 is provided above the element isolation region 37. The contact plug CS6 is formed on the GC interconnect 42, and the M0 interconnect 41 is provided on the contact plug CS6.

The cell guard ring 33 is electrically connected to the M0 interconnect 41 via the contact plug CS5. The GC interconnect 42 is electrically connected to the M0 interconnect 41 via the contact plug CS6. Accordingly, a ground potential Vss is provided to the cell guard ring 33 with the M0 interconnect 41 and the GC interconnect 42.

Further, the M1 interconnect (bit line) BL is provided above the M0 interconnect 43 (source line SL) and the M0 interconnects 38, 41.

Subsequently, the configuration of the guard ring region 11B provided between the memory cell array 11A and the bit line hookup unit 13 will be explained using the schematic views of FIGS. 7 to 11.

Figure 7:
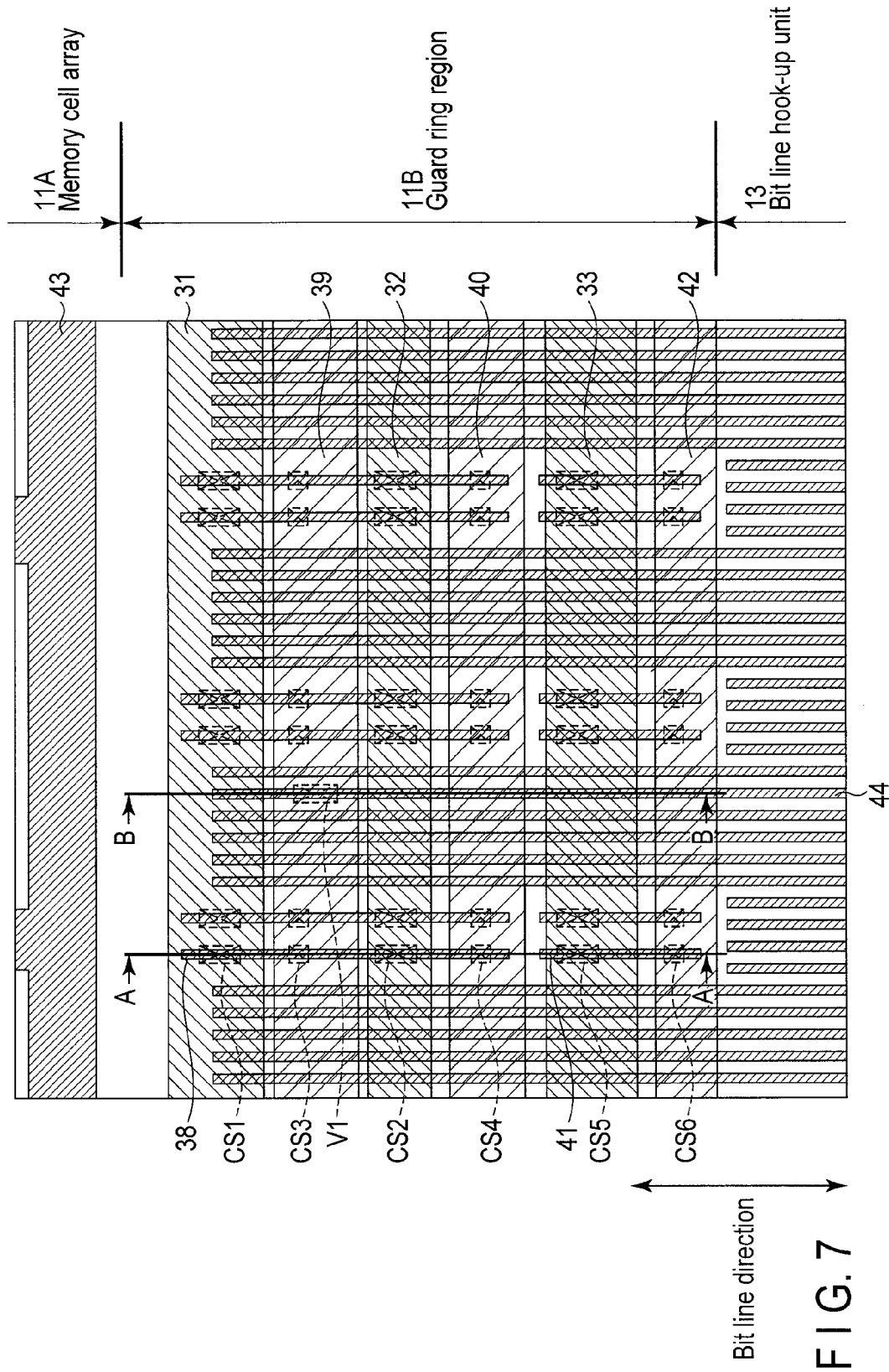
Figure 9:
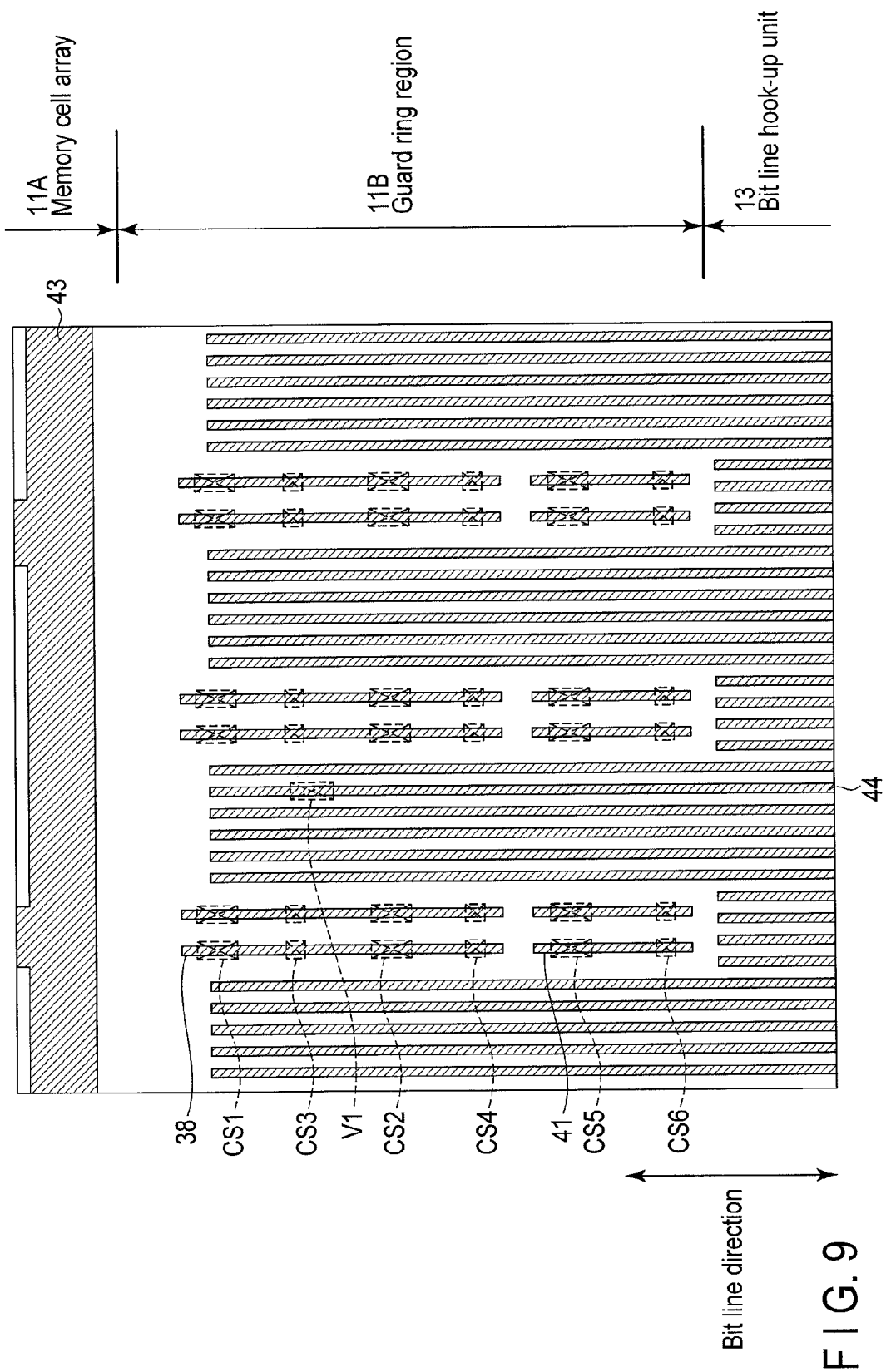

FIG. 7, FIG. 8, and FIG. 9 are top views illustrating pattern layouts of the guard ring region 11B according to the first embodiment.

FIG. 7 shows the cell guard ring, the GC interconnect, the contact plug, and the M0 interconnect. FIG. 8 shows the cell guard ring and the GC interconnect in FIG. 7, and FIG. 9 shows the contact plug and the M0 interconnect in FIG. 7. The M1 interconnect (bit line) arranged above the M0 interconnect is omitted.

As illustrated in FIGS. 7 and 8, the cell guard rings 31, 32, 33 are arranged in the guard ring region 11B between the memory cell array 11A and the bit line hookup unit 13. The cell guard rings 31, 32, 33 are formed of the active area. The GC interconnects 39, 40, 42 for providing potential to the cell guard rings 31, 32, 33 are provided above the cell guard ring.

Further, as illustrated in FIGS. 7 and 9, the M0 interconnects 38, 41 are provided on the GC interconnects 39, 40, 42 and the cell guard rings 31, 32, 33 in the guard ring region 11B. The contact plug CS1 is provided between the M0 interconnect 38 and the cell guard ring 31. Likewise, the contact plugs CS3, CS2, CS4 are respectively provided between the M0 interconnect 38 and the GC interconnect 39, between the M0 interconnect 38 and the cell guard ring 32, and between the M0 interconnect 38 and the GC interconnect 40. Further, the contact plugs CS5, CS6 are respectively provided between the M0 interconnect 41 and the cell guard ring 33 and between the M0 interconnect 41 and the GC interconnect 42.

The M0 interconnect (source line) 43 is provided in the memory cell array 11A. The M0 interconnect 44 is provided in the bit line hookup unit 13. An M1 interconnect (bit line), not shown, is provided to extend in the bit line direction above the M0 interconnect 44. A contact plug V1 is provided between the M0 interconnect 44 and the M1 interconnect. The M1 interconnect is electrically connected to the M0 interconnect 44 via the contact plug V1. Further, the M0 interconnect 44 is electrically connected to the transfer transistor TF in the bit line hookup unit 13.

Figure 10:
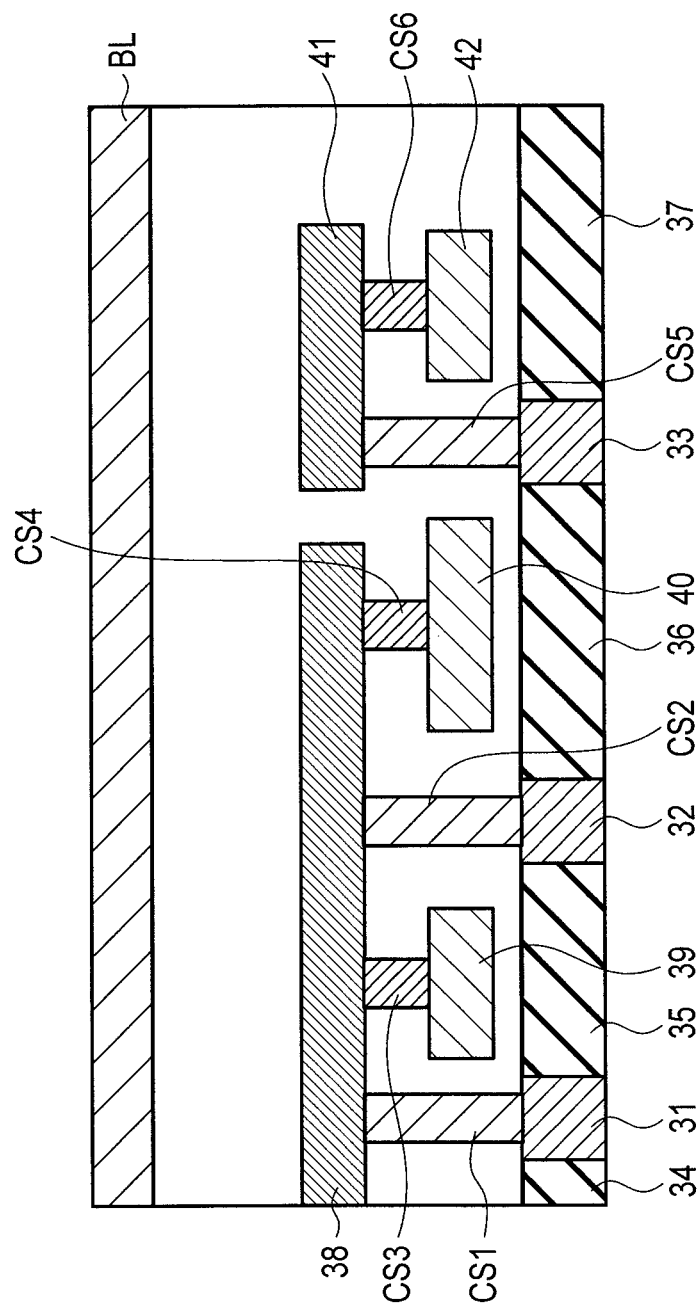
FIG. 10 is a cross sectional view illustrating of the guard ring region as illustrated in FIG. 7 taken along line A-A.

FIG. 10 is a cross sectional view illustrating of the guard ring region 11B as illustrated in FIG. 7 taken along line A-A.

As illustrated in the figure, the cell guard rings 31, 32, 33 are provided in the semiconductor substrate. Element isolation regions 34, 35, 36, 37 are provided between the cell guard rings 31, 32, 33 to isolate them from each other.

GC interconnect layers 39, 40, 42 are provided above the cell guard rings 31, 32, 33 and the element isolation regions 34, 35, 36, 37. The M0 interconnects 38, 41 are provided above the GC interconnect layers 39, 40, 42. Further, the M1 interconnect (bit line) BL is provided above the M0 interconnects 38, 41. In FIG. 10, the inter-layer insulating films between interconnects are omitted.

The cell guard rings 31, 32 are electrically connected to the M0 interconnect 38 with the contact plugs CS1, CS2. The GC interconnects 39, 40 are electrically connected to the M0 interconnect 38 with the contact plugs CS3, CS4. The GC interconnects 39, 40 provide well potential to the cell guard rings 31, 32. The M0 interconnect 38 extend in the bit line direction and electrically connects the GC interconnects 39, 40 and the cell guard rings 31, 32.

The cell guard ring 33 is electrically connected to the M0 interconnect 41 with the contact plug CS5. The GC interconnect 42 is electrically connected to the M0 interconnect 41 with the contact plug CS6. The GC interconnect 42 provides the ground potential Vss to the cell guard ring 33. The M0 interconnect 41 extend in the bit line direction and electrically connects the GC interconnect 42 and the cell guard ring 33.

FIG. 11 is a cross sectional view illustrating of the guard ring region 11B as illustrated in FIG. 7 taken along line B-B.

As illustrated in the figure, like FIG. 10, the cell guard rings 31, 32, 33 are provided in the semiconductor substrate. Element isolation regions 34, 35, 36, 37 are provided between the cell guard rings 31, 32, 33 to isolate them from each other.

GC interconnect layers 39, 40, 42 are provided above the cell guard-rings 31, 32, 33 and the element isolation regions 34, 35, 36, 37. The M0 interconnect 44 are provided above the GC interconnect layers 39, 40, 42. The M1 interconnect (bit line) BL is provided above the M0 interconnect 44.

The contact plug V1 is provided between the M0 interconnect 44 and the M1 interconnect BL. The M1 interconnect BL is electrically connected to the M0 interconnect 44 with the contact plug V1. The M0 interconnect 44 is electrically connected to the transfer transistor TF in the bit line hookup unit 13. In FIG. 11, the inter-layer insulating films between interconnects are omitted.

In the first embodiment, as described above, the contact plug V1 for connecting the M1 interconnect (bit line) BL extending from the memory cell array 11A to the M0 interconnect 44 is provided on the guard ring region 11B, not in the bit line hookup unit 13 where the contact plug V1 was provided in the past. Accordingly, the size of area of the bit line hookup unit 13 can be reduced, and the chip size can be reduced.

More specifically, in the past, in the guard ring region 11B, the M0 interconnect is formed to extend in the direction perpendicular to the bit line direction, and the M0 interconnect is used as interconnect for providing potential to the cell guard ring. Accordingly, the contact plug V1 cannot be provided in the guard ring region 11B, and is provided in the bit line hookup unit 13. In the first embodiment, the M0 interconnect of the guard ring region 11B is formed in parallel to the bit line direction, and is used as an interconnect for simply connecting the cell guard ring and the GC interconnect. Accordingly, the contact plug V1 can be provided on the guard ring region 11B.

Hereinafter, an example of detailed pattern layout in the guard ring region 11B according to the first embodiment will be shown.

Figure 12:
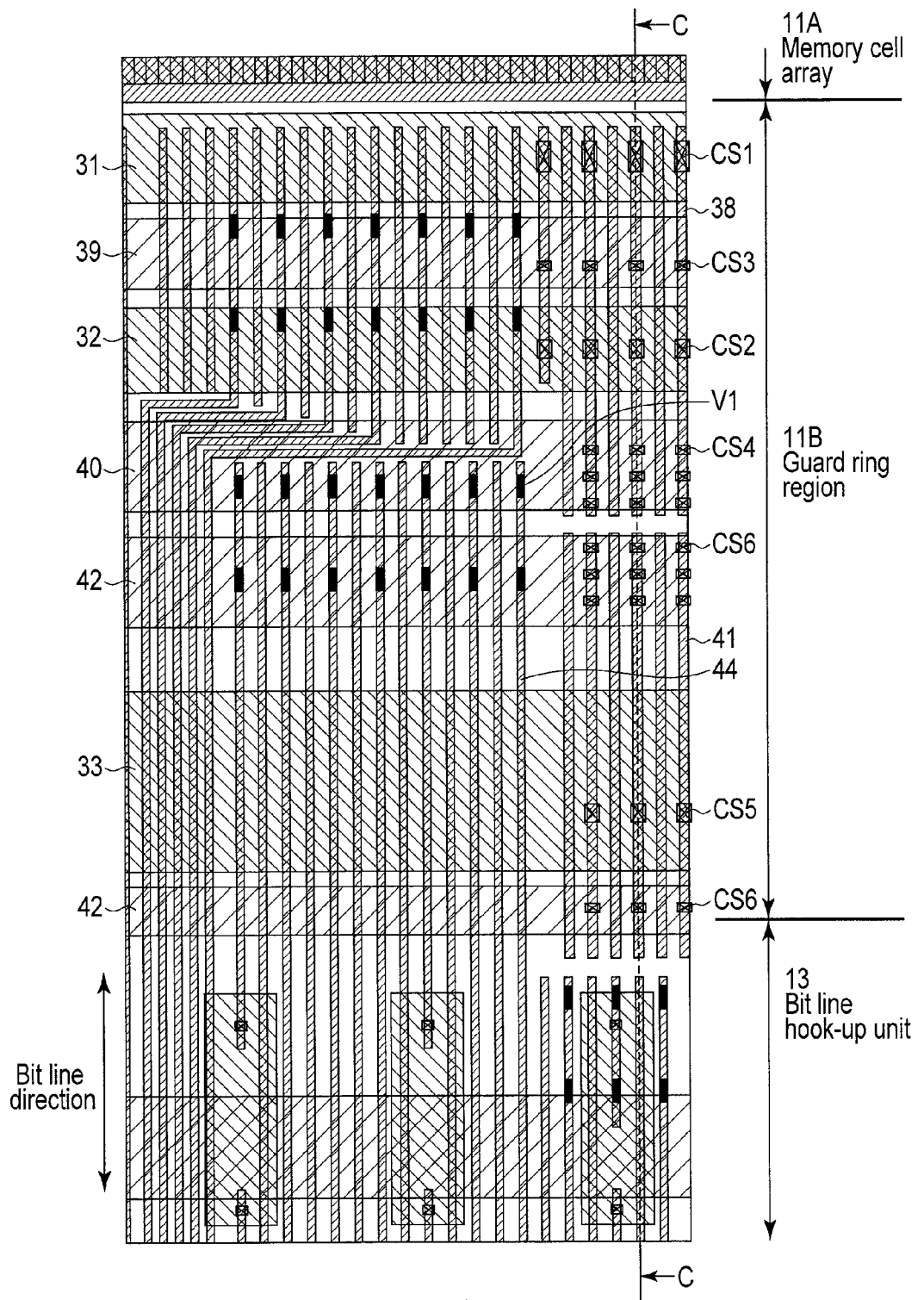
Figure 14:
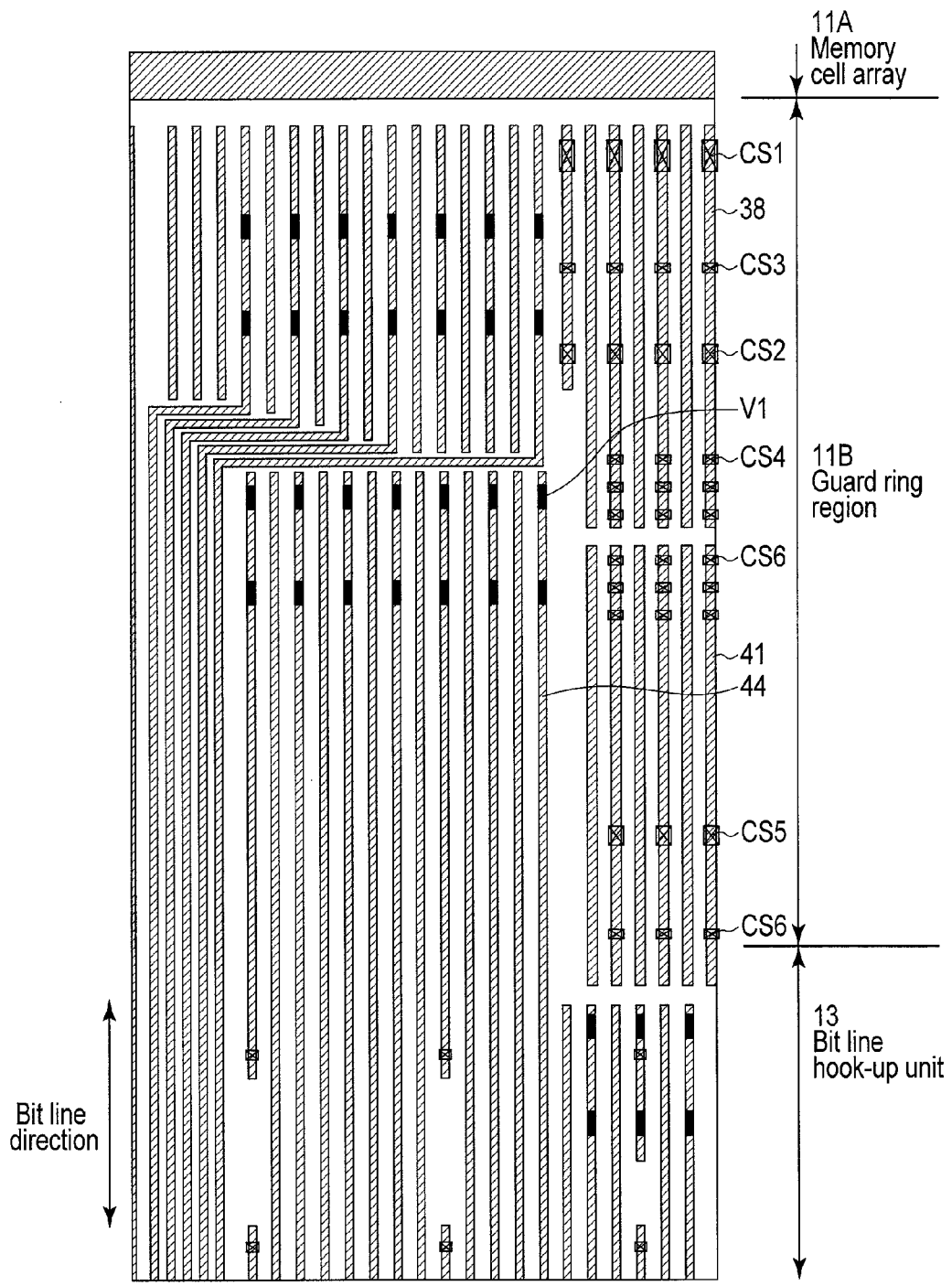

FIGS. 12, 13, and 14 are figures illustrating detailed examples of pattern layouts in the guard ring region 11B. The M1 interconnect arranged above the M0 interconnect is omitted.

FIG. 12 shows the active area for forming the cell guard rings 31, 32, 33, the GC interconnects 39, 40, 42, the contact plugs CS1 to CS6, V1, and the M0 interconnects 38, 41, 44. FIG. 13 shows the active area such as the cell guard rings 31, 32, 33 and the GC interconnects 39, 40, 42 in FIG. 12. FIG. 14 shows the contact plugs CS1 to CS6, V1, and the M0 interconnects 38, 41, 44 in FIG. 12.

As illustrated in FIGS. 12 to 14, the M0 interconnects 41, 44 are densely laid out, and therefore, the effect of reducing the chip size can be sufficiently obtained by moving the position of the contact plug V1 to the region of the guard ring region 11B at the side of the memory cell array.

Figure 15:
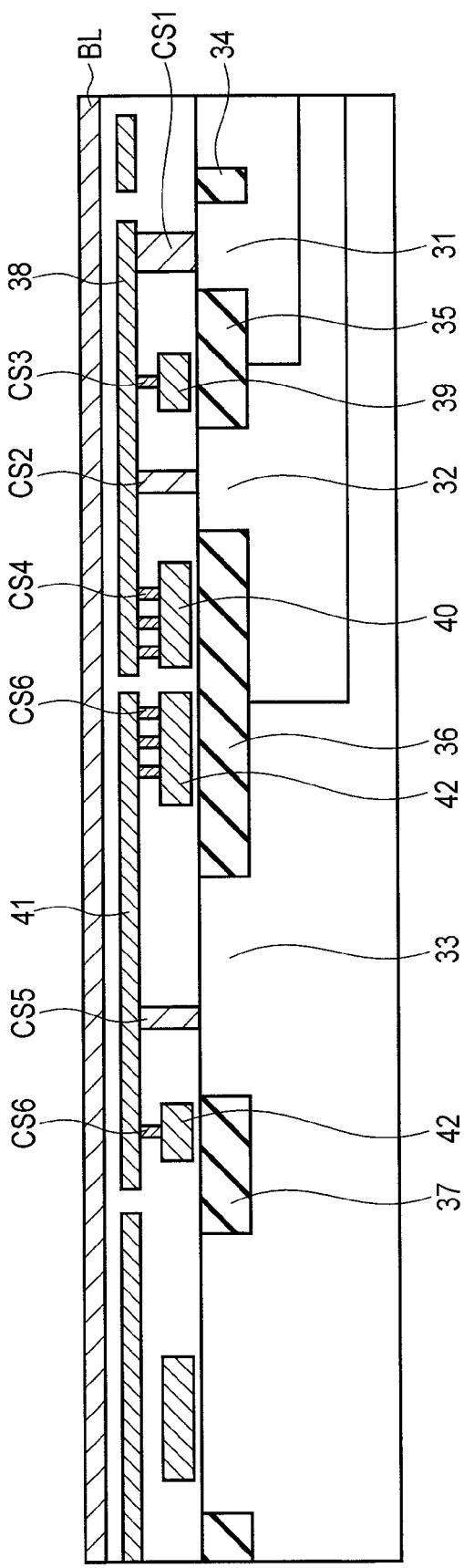
FIG. 15 is a cross sectional view illustrating of the guard ring region as illustrated in FIG. 12 taken along line C-C.

FIG. 15 is a cross sectional view illustrating of the guard ring region 11B as illustrated in FIG. 12 taken along line C-C. In this case, the M1 interconnect (bit line) BL arranged above the M0 interconnect is shown, and the inter-layer insulating films between interconnects are omitted.

As illustrated in the figure, the cell guard rings 31, 32, 33 are provided on the semiconductor substrate. Element isolation regions 34, 35, 36, 37 are provided between the cell guard rings 31, 32, 33 to isolate them from each other.

GC interconnect layers 39, 40, 42 are provided above the cell guard rings 31, 32, 33 and the element isolation regions 34, 35, 36, 37. The M0 interconnects 38, 41 are provided above the GC interconnect layers 39, 40, 42.

The contact plug CS3 is provided between the GC interconnect layer 39 and the M0 interconnect 38. The GC interconnect layer 39 is electrically connected to the M0 interconnect 38 with the contact plug CS3. The contact plug CS4 is provided between the GC interconnect layer 40 and the M0 interconnect 38. The GC interconnect layer 40 is electrically connected to the M0 interconnect 38 with the contact plug CS4.

The contact plug CS1 is provided between the cell guard ring 31 and the M0 interconnect 38. The cell guard ring 31 is electrically connected to the M0 interconnect 38 with the contact plug CS1. The contact plug CS2 is provided between the cell guard ring 32 and the M0 interconnect 38. The cell guard ring 32 is electrically connected to the M0 interconnect 38 with the contact plug CS2.

With these, the cell guard rings 31, 32 are electrically connected to the GC interconnect layers 39, 40.

The contact plugs CS6 are respectively provided between the GC interconnect layer 42 and the M0 interconnect 41. The GC interconnect layer 42 is electrically connected to the M0 interconnect 41 with the contact plug CS6. The contact plug CS5 is provided between the cell guard ring 33 and the M0 interconnect 41. The cell guard ring 33 is electrically connected to the M0 interconnect 41 with the contact plug CS5.

With these, the cell guard ring 33 is electrically connected to the GC interconnect layer 42.

Further, the M1 interconnect (bit line) BL is provided above the M0 interconnects 38, 41.

Figure 25:
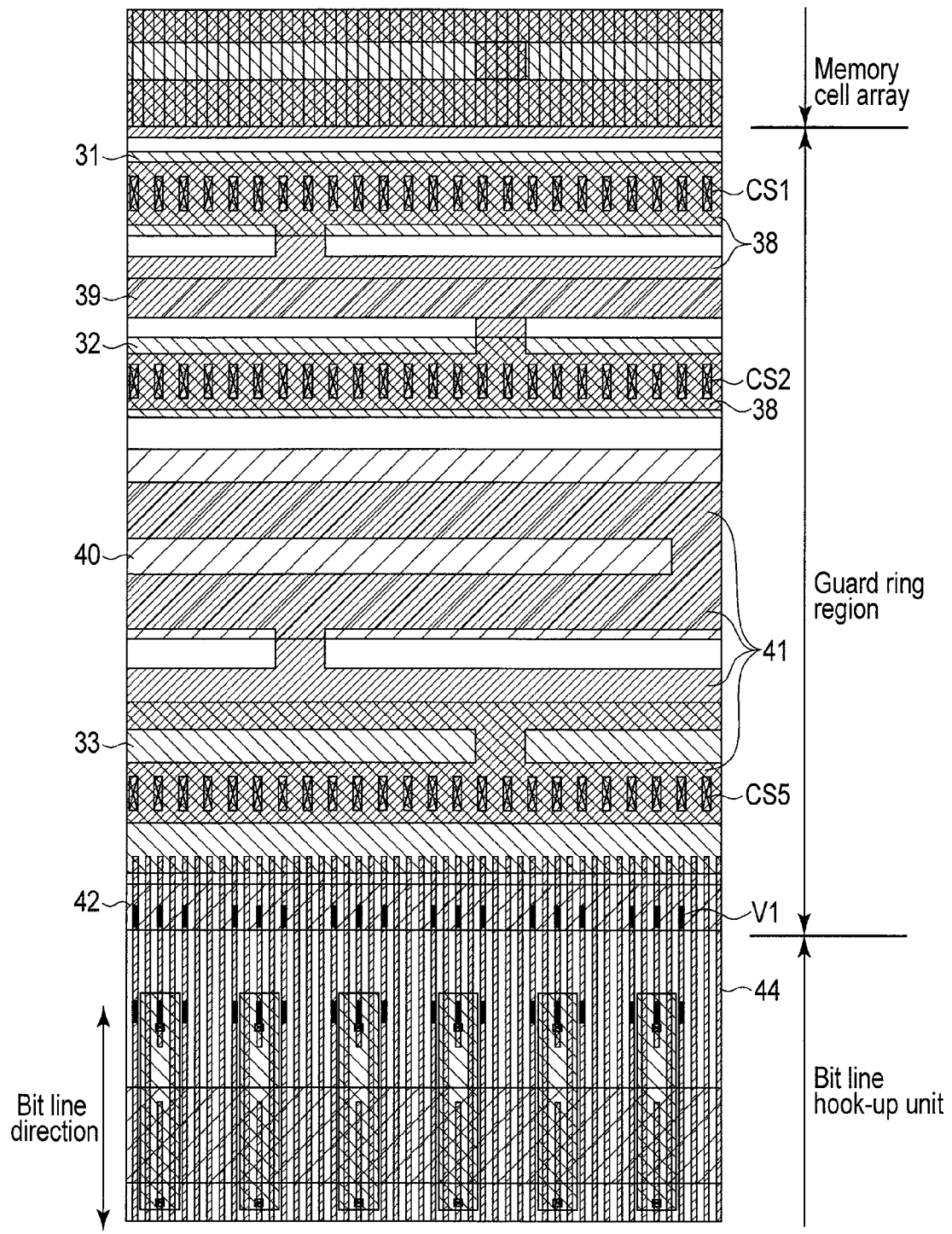
FIG. 25 is a figure illustrating an example of a pattern layout of a guard ring region according to a comparative example.

FIG. 25 illustrates an example of a pattern layout of a guard ring region as a comparative example.

As illustrated in the figure, the cell guard rings 31, 32, 33 are arranged in the guard ring region. The GC interconnects 39, 40, 42 are provided above the cell guard rings, and further, the M0 interconnects 38, 41 are provided above the GC interconnects 39, 40, 42.

The contact plugs CS1, CS2 are respectively provided between the cell guard rings 31, 32 and the M0 interconnect 38. The cell guard rings 31, 32 are respectively electrically connected to the M0 interconnect 38 with the contact plugs CS1, CS2. The contact plug CS5 is provided between the cell guard ring 33 and the M0 interconnect 41. The cell guard ring 33 is electrically connected to the M0 interconnect 41 with the contact plug CS5. No contact plug is provided between the GC interconnects 39, 40, 42 and the M0 interconnects 38, 41. The GC interconnect and the M0 interconnect are not electrically connected.

In the bit line hookup unit, the M0 interconnect 44 is provided. An M1 interconnect (bit line), not shown, is provided to extend in the bit line direction above the M0 interconnect 44. A contact plug V1 is provided between the M0 interconnect 44 and the M1 interconnect. The M1 interconnect is electrically connected to the M0 interconnect 44 via the contact plug V1.

In the comparative example, the M0 interconnect is used as an interconnect for providing potential to the cell guard ring, and therefore, the region (contact plug V1) for connecting the M1 interconnect BL to the M0 interconnect is formed in the bit line hookup unit.

In contrast, in the first embodiment, the GC interconnect provided in the region of the guard ring region 11B is used as the interconnect for providing potential to the cell guard ring. Accordingly, the M0 interconnect used as the interconnect for providing potential to the cell guard ring in the comparative example can be used as the interconnect for connecting to the transfer transistor TF. For this reason, the region for connecting the M1 interconnect (bit line) BL to the M0 interconnect (contact plug V1) can be provided in the guard ring region.

Accordingly, the contact plug V1 that was formed in the bit line hookup unit 13 can be formed in the guard ring region 11B, and therefore, the size of area of the bit line hookup unit 13 can be reduced. As a result, the sense amplifier unit 14 can be arranged close to the side of the memory cell array 11A, and the chip size can be reduced.

Since the GC interconnect is used as the interconnect for providing potential to the cell guard ring, the electric resistance of the GC interconnect, for example, sheet resistance, is desired to be sufficiently lower. For example, preferably, the sheet resistance of the GC interconnect is almost equal to or less than the sheet resistance of the M0 interconnect.

As described according to the first embodiment, the region (including the contact plug V1) for connecting the M1 interconnect (bit line) to the M0 interconnect is provided in the guard ring region where the cell guard rings are formed, so that the chip size can be reduced.

Second Embodiment

In the manufacturing of the semiconductor memory device, after a interconnect layer and an inter-layer insulating film are formed, CMP (Chemical Mechanical Polishing) process is applied in order to generate a uniformly flat surface. In the CMP, a phenomenon called "dishing", i.e., the interconnect material is excessively thinning as compared with the insulating film around the interconnect material, is likely to occur with a wide line & space pattern. On the other hand, a phenomenon called "erosion", i.e., the interconnect material and the insulating film sandwiched the interconnect materials are excessively thinning as compared with the insulating film around them, is likely to occur with a narrow line & space pattern.

In order to prevent them, a coverage rate is set in accordance with the interconnect width, and the interconnect layer is formed to satisfy the coverage rate. For example, setting is made as follows: coverage rate (interconnect width is wide) >coverage rate (interconnect width is narrow). For this reason, in the interface region (guard ring region 11B) between the memory cell array 11A and the bit line hookup unit 13, a region is generated in which both of a wide line & space pattern in a memory cell array and a narrow line & space pattern in a hookup unit exist in a mixed manner and there is a great difference in the coverage rate, and this results in a problem in that dishing and erosion are likely to occur.

In the second embodiment, an example will be explained where, in order to solve such problem, two interconnect layers including a GC interconnect and an M0 interconnect are used as interconnect for providing potential to the cell guard ring, whereby the width of the M0 interconnect in the guard ring region is reduced, and the difference in the coverage rate is reduced in the guard ring region.

The configuration of the guard ring region 11B arranged between the memory cell array 11A and the bit line hookup unit 13 will be explained using the schematic views of FIGS. 16 to 19.

Figure 16:
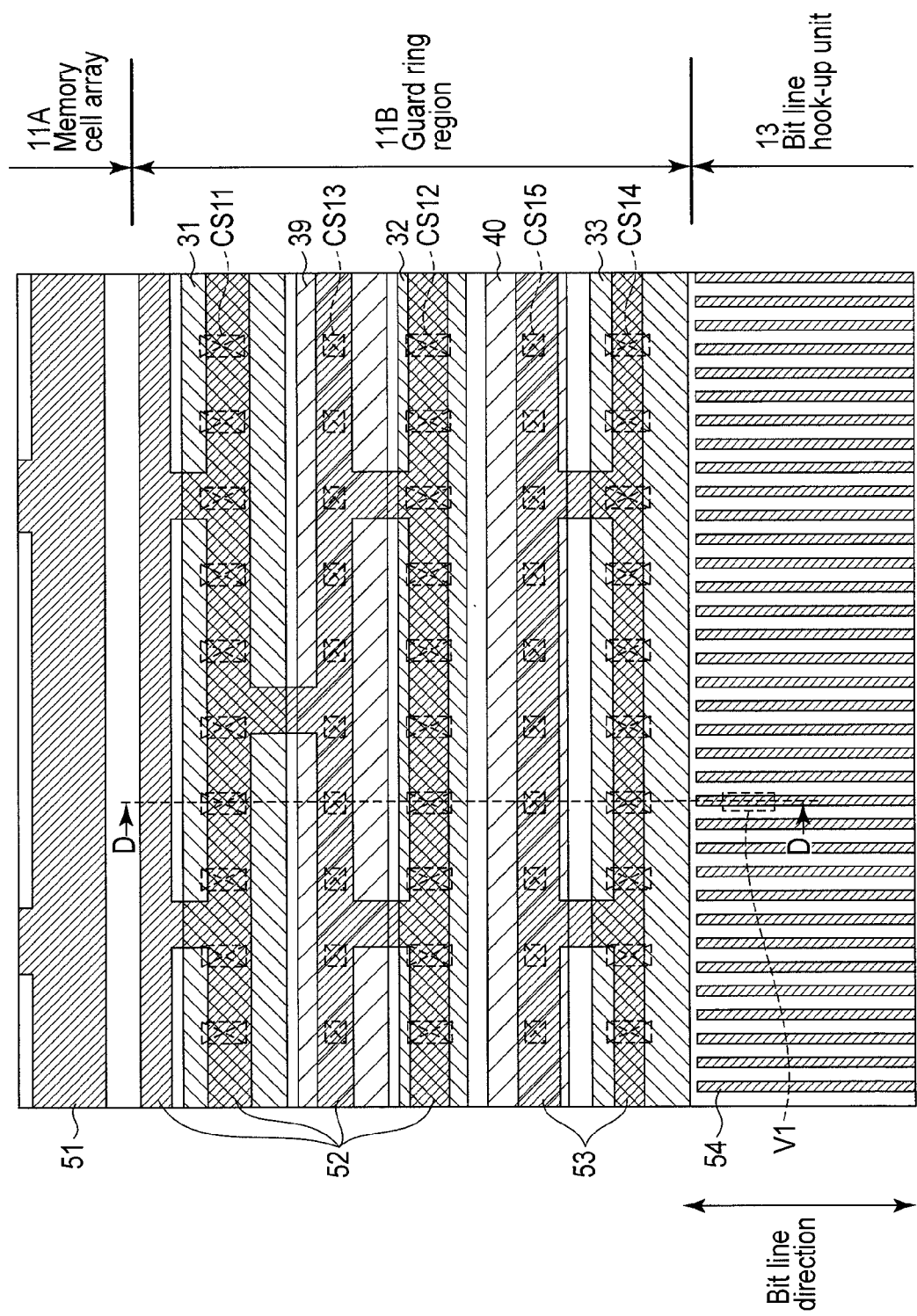
Figure 17:
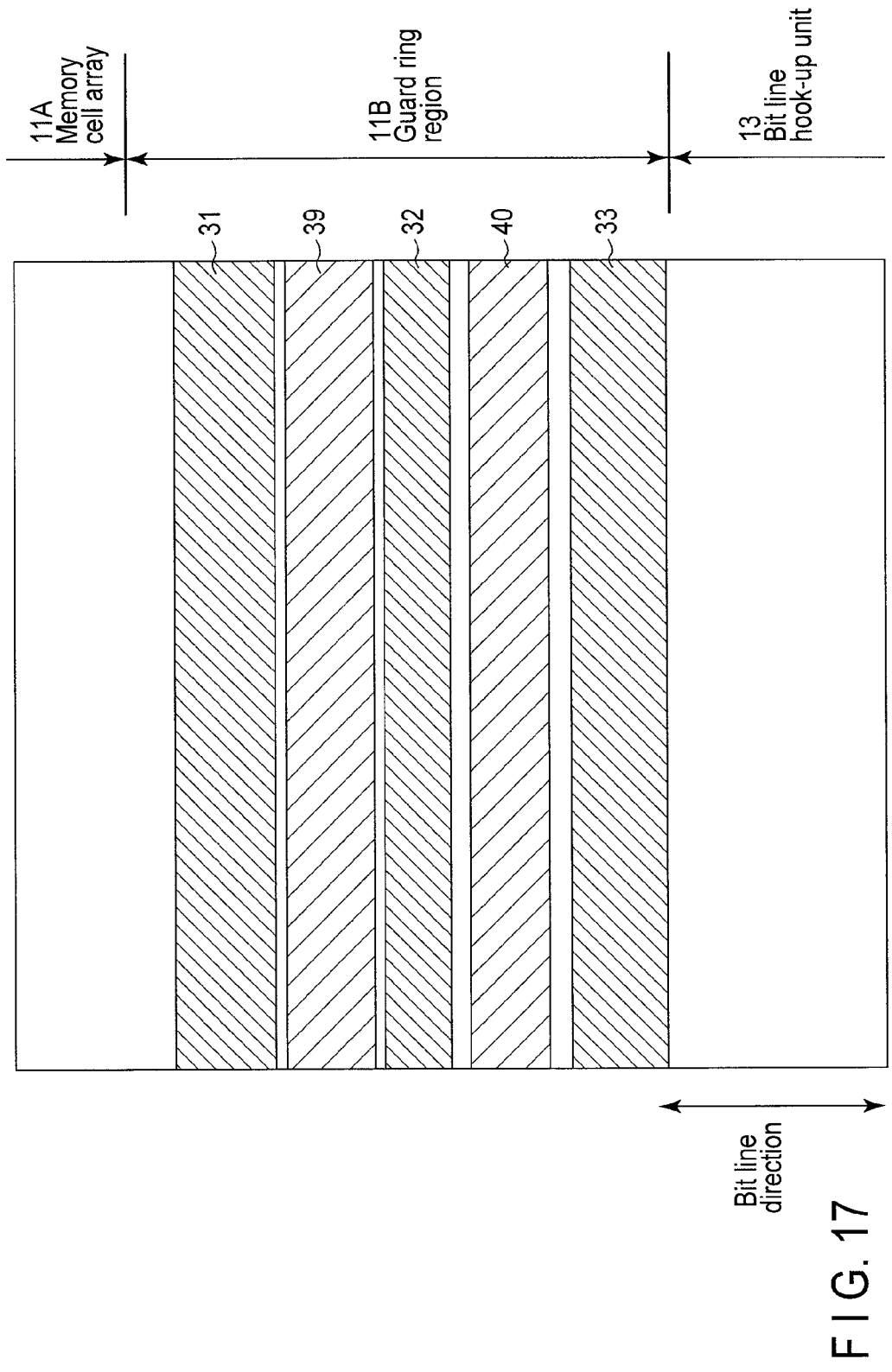

FIGS. 16, 17, and 18 are top views illustrating pattern layouts of the guard ring region 11B according to the second embodiment.

FIG. 16 shows the cell guard ring, the GC interconnect, contact plug, and the M0 interconnect. FIG. 17 shows the cell guard ring and the GC interconnect in FIG. 16, and FIG. 18 shows the contact plug and the M0 interconnect in FIG. 16. The M1 interconnect arranged above the M0 interconnect is omitted.

As illustrated in FIGS. 16 and 17, the cell guard rings 31, 32, 33 are arranged in the guard ring region 11B between the memory cell array 11A and the bit line hookup unit 13. The cell guard rings 31, 32, 33 are formed of the active area. The GC interconnects 39, 40 for providing potential to the cell guard rings are respectively provided between the cell guard rings 31, 32 and between the cell guard rings 32, 33 above the cell guard ring.

Further, as illustrated in FIGS. 16 and 18, the M0 interconnects 52, 53 are provided on the GC interconnects 39, 40 and the cell guard rings 31, 32, 33 in the guard ring region 11B.

The contact plug CS11 is provided between the M0 interconnect 52 and the cell guard ring 31. Likewise, the contact plugs CS12, CS13 are respectively provided between the M0 interconnect 52 and the cell guard ring 32 and between the M0 interconnect 52 and the GC interconnect 39. The M0 interconnect 52 and the GC interconnect 39 provide well potential to the cell guard rings 31, 32.

The contact plugs CS14, CS15 are arranged respectively between the M0 interconnect 53 and the cell guard ring 33 and between the M0 interconnect 53 and the GC interconnect 40. The M0 interconnect 53 and the GC interconnect 40 provide the ground potential Vss to the cell guard ring 33.

The M0 interconnect (source line) 51 is provided in the memory cell array 11A. The M0 interconnect 54 is provided in the bit line hookup unit 13. An M1 interconnect (bit line), not shown, is provided to extend in the bit line direction above the M0 interconnect 54. A contact plug V1 is provided between the M0 interconnect 54 and the M1 interconnect. The M1 interconnect is electrically connected to the M0 interconnect 54 with the contact plug V1. Further, the M0 interconnect 54 is electrically connected to the transfer transistor TF in the bit line hookup unit 13.

FIG. 19 is a cross sectional view illustrating of the guard ring region 11B as illustrated in FIG. 16 taken along line D-D.

As illustrated in the figure, the cell guard rings 31, 32, 33 are provided in the semiconductor substrate. Element isolation regions 34, 35, 36, 37 are provided between the cell guard rings 31, 32, 33 to isolate them from each other.

GC interconnect layers 39, 40 are provided above the cell guard rings 31, 32, 33 and the element isolation regions 34, 35, 36, 37. The M0 interconnects 52, 53 are provided above the GC interconnect layers 39, 40. In FIG. 19, the inter-layer insulating films between interconnects are omitted.

The cell guard rings 31, 32 are electrically connected to the M0 interconnect 52 with the contact plugs CS11, CS12. The GC interconnect 39 is electrically connected to the M0 interconnect 52 with the contact plug CS13. The M0 interconnect 52 and the GC interconnect 39 provide well potential to the cell guard rings 31, 32.

The cell guard ring 33 is electrically connected to the M0 interconnect 53 with the contact plug CS14. The GC interconnect 40 is electrically connected to the M0 interconnect 53 with the contact plug CS15. The M0 interconnect 53 and the GC interconnect 40 provide the ground potential Vss to the cell guard ring 33.

In the bit line hookup unit 13, the M0 interconnect 54 is provided. The M1 interconnect (bit line) BL is provided above the M0 interconnects 52, 53, 54. A contact plug V1 is provided between the M0 interconnect 54 and the M1 interconnect. The M1 interconnect BL is electrically connected to the M0 interconnect 54 with the contact plug V1. The M0 interconnect 54 is electrically connected to the transfer transistor TF in the bit line hookup unit 13.

As described above, the GC interconnects 39, 40 and the M0 interconnect 52, 53 are used as interconnects for providing potential to the cell guard rings 31, 32, 33, and accordingly, an electric current can be passed through both interconnect layers, i.e., the GC interconnect and the M0 interconnect, and therefore the widths of the M0 interconnects 52, 53 can be reduced. Accordingly, the widths of the M0 interconnect 51, 52 (53), 54 are as follows: 51>52 (53)>54, and the maximum coverage rates of the M0 interconnects are as follows: 51>52 (53)>54. Therefore, this can reduce the difference in the coverage rates of the M0 interconnects, and accordingly, this can reduce occurrence of dishing and erosion in the M0 interconnects.

Hereinafter, an example of detailed pattern layout in the guard ring region 11B according to the second embodiment will be shown.

Figure 20:
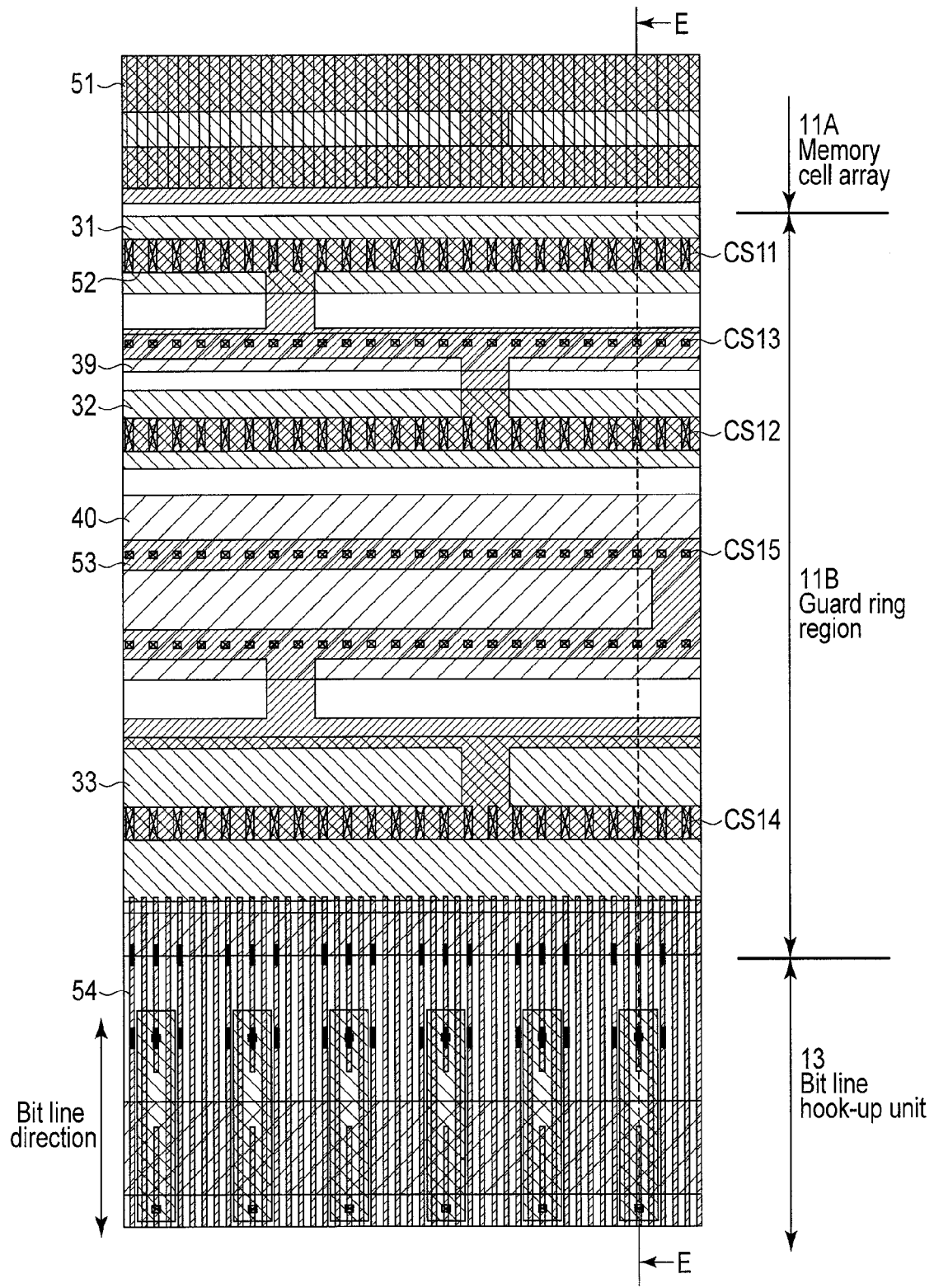
Figure 21:
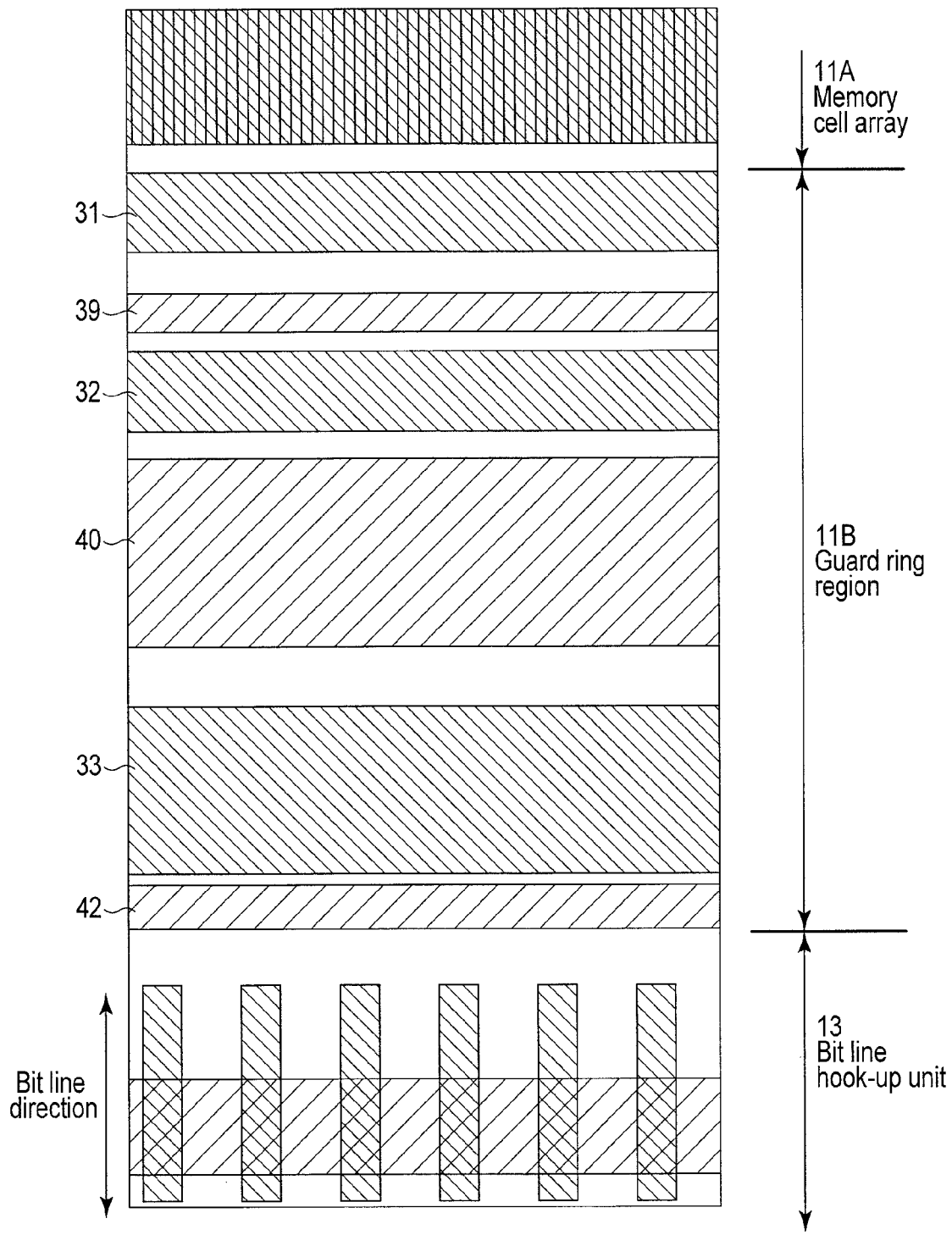

FIGS. 20, 21, and 22 are figures illustrating detailed examples of pattern layouts in the guard ring region 11B. The M1 interconnect arranged above the M0 interconnect is omitted.

FIG. 20 shows the active area for forming the cell guard rings 31, 32, 33, the GC interconnects 39, 40, the contact plugs CS11 to CS15, V1, and the M0 interconnects 51 to 54. FIG. 21 shows the active area such as the cell guard rings 31, 32, 33 and the GC interconnects 39, 40 in FIG. 20. FIG. 22 shows the contact plugs CS11 to CS15, V1, and the M0 interconnects 51 to 54 in FIG. 20.

As illustrated in FIGS. 20 to 22, the widths of the M0 interconnects 51, 52 (53), 54 are as follows: 51>52 (53)>54, and this can reduce the difference in the coverage rates of the M0 interconnects, and accordingly, this can reduce dishing and erosion occurring in the M0 interconnects.

Figure 23:
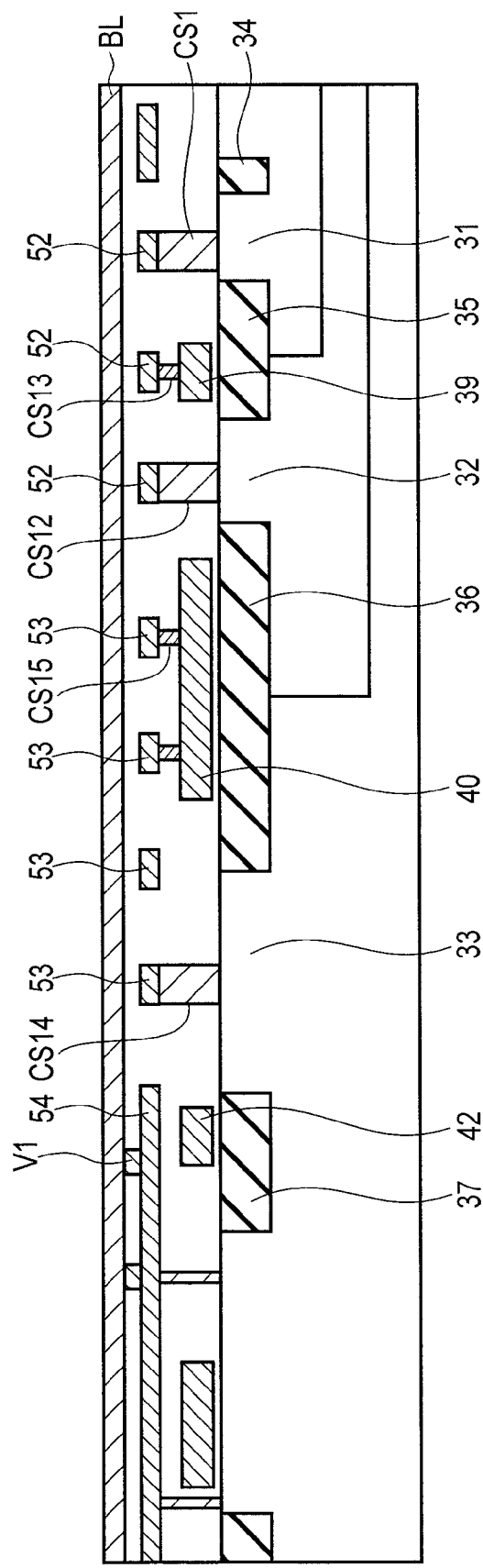
FIG. 23 is a cross sectional view illustrating of the guard ring region as illustrated in FIG. 20 taken along line E-E.

FIG. 23 is a cross sectional view illustrating of the guard ring region 11B as illustrated in FIG. 20 taken along line E-E. In this case, the M1 interconnect (bit line) BL arranged above the M0 interconnect is shown, and the inter-layer insulating films between interconnects are omitted.

As illustrated in the figure, the cell guard rings 31, 32, 33 are provided in the semiconductor substrate. Element isolation regions 34, 35, 36, 37 are provided between the cell guard rings 31, 32, 33 to isolate them from each other.

GC interconnect layers 39, 40, 42 are provided above the cell guard rings 31, 32, 33 and the element isolation regions 34, 35, 36, 37. The M0 interconnects 52, 53, 54 are provided above the GC interconnect layers 39, 40, 42.

The contact plug CS13 is provided between the GC interconnect layer 39 and the M0 interconnect 52. The GC interconnect layer 39 is electrically connected to the M0 interconnect 52 with the contact plug CS13. The contact plug CS11 is provided between the cell guard ring 31 and the M0 interconnect 52. The cell guard ring 31 is electrically connected to the M0 interconnect 52 with the contact plug CS11. The contact plug CS12 is provided between the cell guard ring 32 and the M0 interconnect 52. The cell guard ring 32 is electrically connected to the M0 interconnect 52 with the contact plug CS12.

With these, the cell guard rings 31, 32 are electrically connected to the GC interconnect layer 39 and the M0 interconnect 52.

The contact plug CS15 is provided between the GC interconnect layer 40 and the M0 interconnect 53. The GC interconnect layer 40 is electrically connected to the M0 interconnect 53 with the contact plug CS15. The contact plug CS14 is provided between the cell guard ring 33 and M0 interconnect 53. The cell guard ring 33 is electrically connected to the M0 interconnect 53 with the contact plug CS14.

With these, the cell guard ring 33 is electrically connected to the GC interconnect layer 40 and the M0 interconnect 53.

The M0 interconnect 54 is provided above the GC interconnect layer 42. The M1 interconnect (bit line) BL is provided above the M0 interconnects 52, 53, 54.

A contact plug V1 is provided between the M0 interconnect 54 and the M1 interconnect BL. The M0 interconnect 54 is electrically connected to the M1 interconnect BL with the contact plug V1.

In the comparative example as illustrated in FIG. 25, the M0 interconnects are used as interconnects for providing potential to the cell guard rings, but no GC interconnect is used. Therefore, it is necessary to increase the width of the M0 interconnect.

In contrast, in the second embodiment, the GC interconnect on the guard ring region 11B is used as the interconnect for giving potential to the cell guard ring, so that this can reduce the width of the M0 interconnect providing potential to the cell guard ring. In addition, the M0 interconnect width in the guard ring region (interface region) 11B is set as a interconnect width of about the middle of the M0 interconnect width in the memory cell array 11A and the M0 interconnect width in the bit line hookup unit 13, and this alleviates the difference in the coverage rates of the M0 interconnects in the three regions, i.e., the memory cell array 11A, the guard ring region 11B, and the bit line hookup unit 13. Accordingly, this can suppress occurrence of dishing and erosion in the memory cell array 11A, the bit line hookup unit 13, and the guard ring region 11B at the interface thereof. As a result, this can improve the yield of production of the semiconductor memory devices having the above configuration. Moreover, since the M0 interconnect width in the guard ring region 11B can be reduced, the chip size can also be reduced.

When the sheet resistance of the GC interconnect is not low, the interconnect width of the M0 interconnect in the guard ring region cannot be reduced, and this increases the difference in the interconnect widths between the guard ring region 11B and the bit line hookup unit 13. In such case, it is difficult to reduce occurrence of dishing and erosion.

Therefore, in the second embodiment, preferably, the sheet resistance (electric resistance) of the GC interconnect is sufficiently low, for example, the sheet resistance of the GC interconnect is equal to or less than the sheet resistance of the M0 interconnect. When the sheet resistance of the GC interconnect is low, and the GC interconnect can be used as the interconnect for providing potential to the cell guard ring, this can reduce the difference in the coverage rate of the M0 interconnect at the interface region of the memory cell array and the bit line hookup unit and can suppress occurrence of dishing and erosion as described above.

As illustrated in FIG. 24, the memory cell MC and the select gate transistors SGD, SGS used in the present embodiment may have such structure that air gaps 60A, 60B, 60C are formed in the gate sidewalls. When such structure is employed for the memory cell MC and the select gate transistors SGD, SGS, the parasitic capacitance of the word line and the select gate line can be reduced, and the signal delay in the word line and the select gate line can be reduced. Accordingly, the operation speed of writing, reading, and erasing can be improved.

As described above, according to the embodiments, the chip size can be reduced, or occurrence of dishing and erosion can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array in which memory cells arranged at positions where bit lines and word lines cross each other are arranged on a semiconductor substrate;
   a sense amplifier configured to read data stored in one of the memory cells via the bit line in a read operation;
   a hookup region comprising a transfer transistor arranged between the memory cell array and the sense amplifier, one end of a current path of the transfer transistor being connected to a first interconnect formed between the semiconductor substrate and the bit line, the other end of the current path of the transfer transistor being connected to the sense amplifier;

a guard ring region arranged between the memory cell array and the hookup region and enclosing the memory cell array, the guard ring region including a cell guard ring providing potential to the semiconductor substrate;

a first contact plug arranged to overlap the guard ring region, the first contact plug electrically connecting the bit line to the first interconnect;

a second interconnect formed between the semiconductor substrate and the first interconnect in the guard ring region, the second interconnect providing the potential to the cell guard ring;

a third interconnect arranged in a same interconnect layer as the first interconnect and having the potential provided to the cell guard ring; and a second contact plug arranged between the second interconnect and the third interconnect and electrically connecting the second interconnect and the third interconnect.

2. The semiconductor memory device according to claim 1, further comprising a third contact plug arranged between the cell guard ring and the third interconnect, the third contact plug electrically connecting the cell guard ring and the third interconnect.

3. The semiconductor memory device according to claim 1, wherein the cell guard ring includes an active area of the semiconductor substrate.

4. The semiconductor memory device according to claim 1, wherein an electric resistance of the second interconnect is equal to or less than an electric resistance of the first interconnect.

5. The semiconductor memory device according to claim 1, wherein the memory cell array includes a NAND cell unit.

6. The semiconductor memory device according to claim 5, wherein the NAND cell unit includes the memory cells connected in series and first, second select gate transistors connected to sandwich the memory cells.

7. The semiconductor memory device according to claim 6, wherein one end of the NAND cell unit is connected to the bit line via the first select gate transistor.

8. The semiconductor memory device according to claim 6, wherein the second interconnect is formed in a same interconnect layer as the gate electrode of one of the memory cells.

9. The semiconductor memory device according to claim 1, wherein the sense amplifier includes a low withstand voltage transistor, and the transfer transistor includes a high withstand voltage transistor having a withstand voltage which is higher than a withstand voltage of the low withstand voltage transistor.

10. A semiconductor memory device comprising:

a memory cell array in which memory cells each connected to a bit line and a word line are arranged on a semiconductor substrate;

a sense amplifier configured to read data stored in one of the memory cells via the bit line in a read operation;

a hookup region comprising a transfer transistor arranged between the memory cell array and the sense amplifier, one end of a current path of the transfer transistor being connected to a first interconnect formed between the semiconductor substrate and the bit line, the other end of the current path of the transfer transistor being connected to the sense amplifier;

a guard ring region arranged between the memory cell array and the hookup region and enclosing the memory cell array, the guard ring region including a cell guard ring providing potential to the semiconductor substrate;

a second interconnect formed in a same interconnect layer as the first interconnect on the memory cell array;

a third interconnect formed in a same interconnect layer as the first interconnect on the guard ring region and providing the potential to the cell guard ring, wherein a width of the third interconnect is narrower than a width of the second interconnect but is wider than a width of the first interconnect;

a fourth interconnect formed between the semiconductor substrate and the first interconnect in the guard ring region, the fourth interconnect providing the potential to the cell guard ring; and a first contact plug arranged between the third interconnect and the fourth interconnect and electrically connecting the third interconnect and the fourth interconnect.

11. The semiconductor memory device according to claim 10, further comprising a second contact plug arranged between the cell guard ring and the third interconnect and electrically connecting the cell guard ring and the third interconnect.

12. The semiconductor memory device according to claim 11, further comprising a third contact plug arranged to overlap the guard ring region and electrically connecting the bit line to the first interconnect.

13. The semiconductor memory device according to claim 10, wherein the cell guard ring includes an active area of the semiconductor substrate.

14. The semiconductor memory device according to claim 10, wherein an electric resistance of the fourth interconnect is equal to or less than an electric resistance of the first interconnect.

15. The semiconductor memory device according to claim 10, wherein the memory cell array includes a NAND cell unit.

16. The semiconductor memory device according to claim 15, wherein the NAND cell unit includes the memory cells connected in series and first, second select gate transistors connected to sandwich the memory cells.

17. The semiconductor memory device according to claim 16, wherein one end of the NAND cell unit is connected to the bit line via the first select gate transistor.

18. The semiconductor memory device according to claim 10, wherein the fourth interconnect is formed in a same interconnect layer as the gate electrode of one of the memory cells.

* * * * *